(12) United States Patent
Baba et al.

(10) Patent No.: US 11,037,701 B2
(45) Date of Patent: Jun. 15, 2021

(54) TRANSMISSION LINE SUBSTRATE AND ELECTRONIC DEVICE

(71) Applicant: Murata Manufacturing Co., Ltd., Nagaokakyo (JP)

(72) Inventors: Takahiro Baba, Nagaokakyo (JP); Lijun Zhao, Nagaokakyo (JP); Chu Xu, Nagaokakyo (JP); Hiromasa Koyama, Nagaokakyo (JP); Satoshi Matsuura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/181,717

(22) Filed: Nov. 6, 2018

(65) Prior Publication Data

US 2019/0088388 A1   Mar. 21, 2019

(30) Foreign Application Priority Data

May 17, 2016 (JP) .............................. JP2016-098850
Aug. 18, 2016 (JP) .............................. JP2016-160664
Jan. 6, 2017 (JP) .............................. JP2017-000843

(51) Int. Cl.
*H01B 11/00* (2006.01)
*H05K 1/02* (2006.01)
(Continued)

(52) U.S. Cl.
CPC ............. *H01B 11/002* (2013.01); *H01B 7/18* (2013.01); *H01P 3/08* (2013.01); *H05K 1/0221* (2013.01);
(Continued)

(58) Field of Classification Search
CPC ...... H05K 3/0014; H05K 3/45; H05K 3/4697; H05K 1/02; H05K 1/11; H05K 1/0221;
(Continued)

(56) References Cited

U.S. PATENT DOCUMENTS 6,040,524 A * 3/2000 Kobayashi ........... H05K 1/0219
174/36
6,133,805 A * 10/2000 Jain ........................ H01P 3/088
333/1
(Continued)

FOREIGN PATENT DOCUMENTS

DE     27 23 163 A1    11/1978
JP     H05226500     *  9/1993  ............ H01L 23/12
(Continued)

OTHER PUBLICATIONS

Official Communication issued in corresponding Japanese Patent Application No. 2020-077352, dated Mar. 23, 2021.

*Primary Examiner* — Steven T Sawyer
*Assistant Examiner* — Paresh H Paghadal
(74) *Attorney, Agent, or Firm* — Keating & Bennett, LLP

(57) ABSTRACT

A transmission line substrate includes a stacked body that includes insulating base materials, first and second signal lines, and first and second ground conductors. The second signal line is provided on a layer different from the layer of the first signal line and extends in parallel with the first signal line. The first ground conductor is provided on the same layer as the layer of the second signal line and overlapped with the first signal line when viewed in the Z-axis direction. The second ground conductor is provided on the same layer as the layer of the first signal line and overlapped with the second signal line when viewed in the Z-axis direction. A first transmission line includes the first signal line, the first ground conductor, and an insulating base material, and a second transmission line includes the second signal line, the second ground conductor, and the insulating base material.

21 Claims, 19 Drawing Sheets

(51) Int. Cl.
*H01P 3/08* (2006.01)
*H05K 1/11* (2006.01)
*H01B 7/18* (2006.01)
*H05K 3/46* (2006.01)

(52) U.S. Cl.
CPC .............. *H05K 1/11* (2013.01); *H05K 1/0298* (2013.01); *H05K 3/4697* (2013.01); *H05K 2201/0723* (2013.01); *H05K 2201/09018* (2013.01); *H05K 2201/09236* (2013.01); *H05K 2201/09618* (2013.01); *H05K 2201/09709* (2013.01)

(58) Field of Classification Search
CPC ....... H05K 1/0298; H05K 2201/09618; H05K 2201/09236; H05K 2201/09018; H05K 2201/0723; H01P 3/00; H01P 3/08; H01P 3/18; H01P 3/081; H01P 3/082; H01P 3/088; H01P 5/028; H01B 11/002; H01B 7/18

See application file for complete search history.

(56) References Cited

U.S. PATENT DOCUMENTS

| | | | |
|---|---|---|---|
| 9,930,770 B2 * | 3/2018 | Kim | H05K 1/0218 |
| 2005/0099240 A1 | 5/2005 | Lin et al. | |
| 2005/0156692 A1 | 7/2005 | Dove et al. | |
| 2010/0182105 A1 * | 7/2010 | Hein | H05K 1/0219 |
| | | | 333/239 |
| 2011/0121922 A1 * | 5/2011 | Blair | H01P 3/00 |
| | | | 333/238 |
| 2012/0039016 A1 * | 2/2012 | Togashi | H01G 4/35 |
| | | | 361/302 |
| 2013/0106528 A1 * | 5/2013 | Christian | H05K 1/0251 |
| | | | 333/33 |
| 2013/0322029 A1 * | 12/2013 | Hurwitz | H05K 9/0024 |
| | | | 361/748 |
| 2014/0071646 A1 * | 3/2014 | Qian | H05K 1/0219 |
| | | | 361/777 |
| 2014/0292449 A1 | 10/2014 | Kato et al. | |
| 2015/0295296 A1 * | 10/2015 | Ikemoto | H01Q 21/0075 |
| | | | 343/893 |
| 2015/0296609 A1 * | 10/2015 | Hsu | H05K 1/0224 |
| | | | 174/262 |
| 2016/0028140 A1 * | 1/2016 | Kato | H05K 1/0242 |
| | | | 333/238 |
| 2017/0042020 A1 * | 2/2017 | Kim | H05K 1/0218 |
| 2017/0069943 A1 * | 3/2017 | Chayat | H01P 1/20345 |
| 2017/0084974 A1 | 3/2017 | Baba et al. | |
| 2017/0187087 A1 | 6/2017 | Baba et al. | |

FOREIGN PATENT DOCUMENTS

| | | | | |
|---|---|---|---|---|
| JP | 11-054943 A | | 2/1999 | |
| JP | H11163539 A | * | 6/1999 | ....... H01L 2224/162 |
| JP | 2001144451 A | * | 5/2001 | ............... H05K 1/02 |
| JP | 2002-185219 A | | 6/2002 | |
| JP | 2003-008310 A | | 1/2003 | |
| JP | 2003069239 A | * | 3/2003 | ............... H05K 1/02 |
| JP | 2003-188609 A | | 7/2003 | |
| JP | 2006-024618 A | | 1/2006 | |
| JP | 2009-124044 A | | 6/2009 | |
| JP | 2010-123710 A | | 6/2010 | |
| JP | 2014-192384 A | | 10/2014 | |
| WO | 2013/103130 A1 | | 7/2013 | |
| WO | WO-2015005028 A1 | * | 1/2015 | ............. H01P 3/085 |
| WO | 2015/186720 A1 | | 12/2015 | |
| WO | 2016/047540 A1 | | 3/2016 | |

* cited by examiner

Fig.4
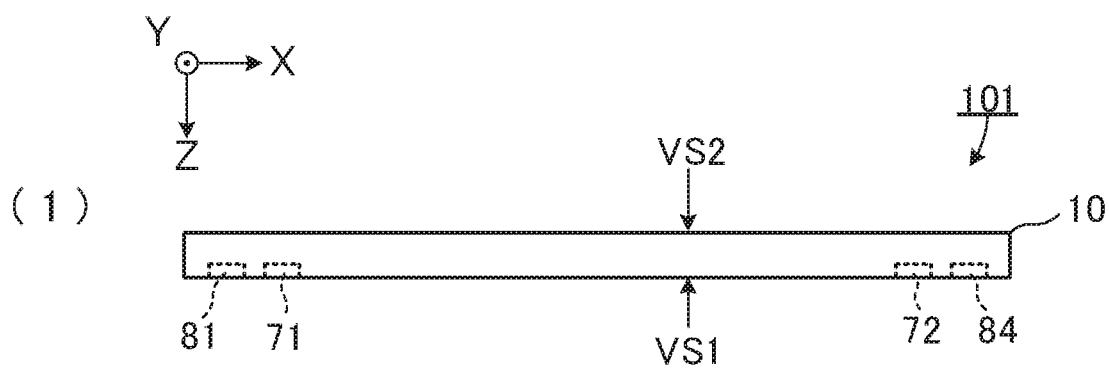
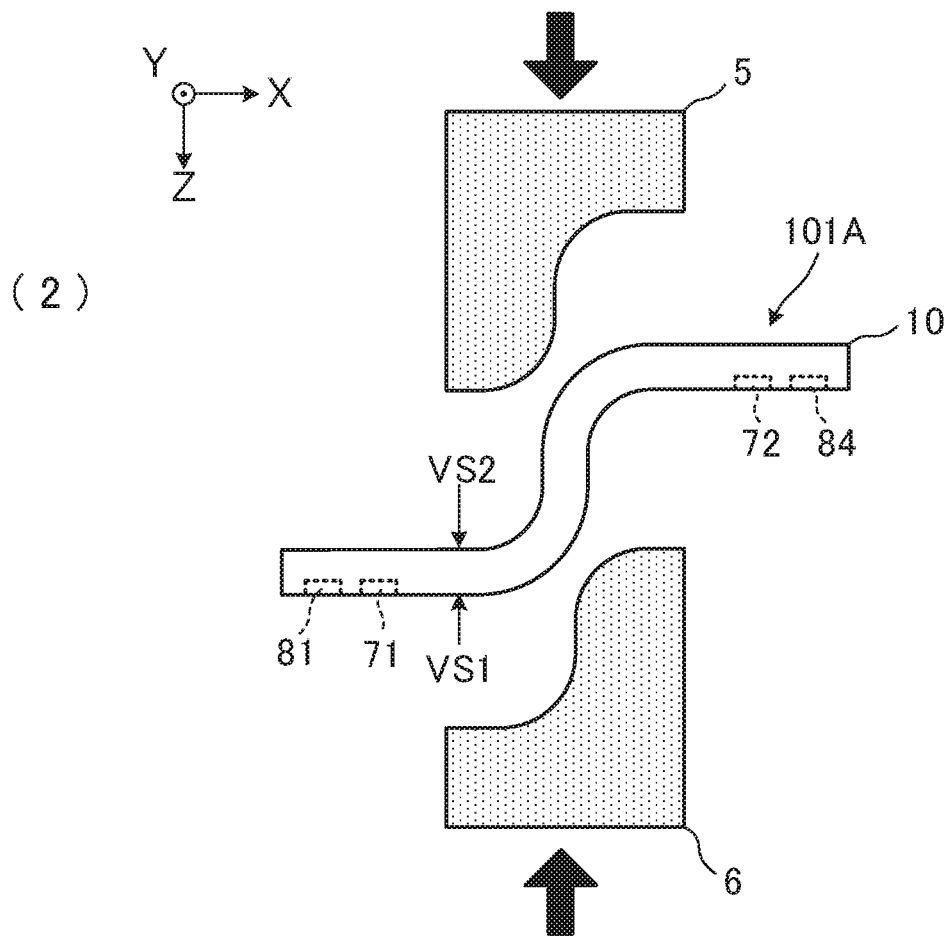

Fig.5A
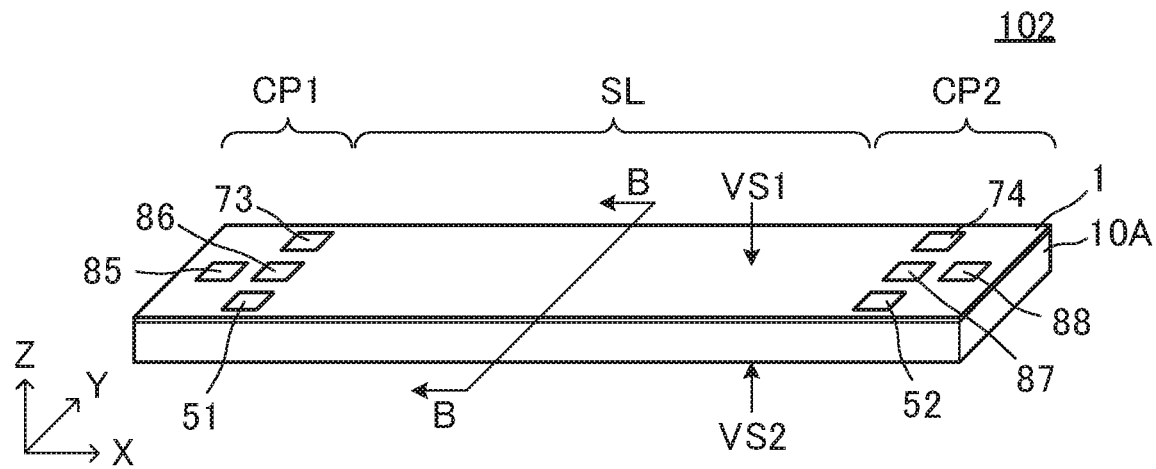
Fig.5B
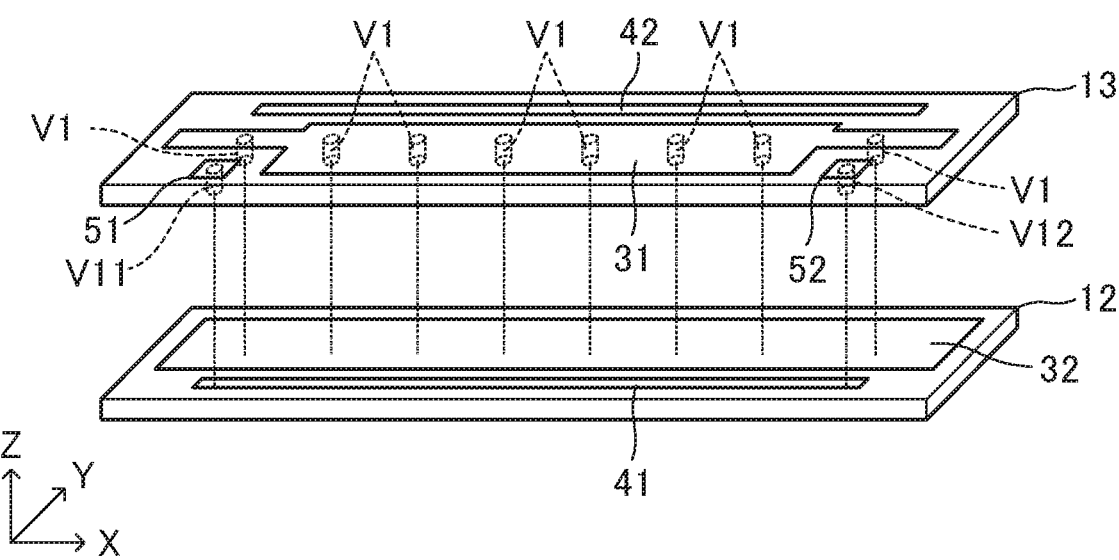

TRANSMISSION LINE SUBSTRATE AND ELECTRONIC DEVICE

CROSS REFERENCE TO RELATED APPLICATIONS

This application claims the benefit of priority to Japanese Patent Application No. 2016-098850 filed on May 17, 2016, Japanese Patent Application No. 2016-160664 filed on Aug. 18, 2016, Japanese Patent Application No. 2017-000843 filed on Jan. 6, 2017 and is a Continuation Application of PCT Application No. PCT/JP2017/018271 filed on May 16, 2017. The entire contents of each application are hereby incorporated herein by reference.

BACKGROUND OF THE INVENTION

1. Field of the Invention

The present invention relates to a transmission line substrate, and more particularly to a transmission line substrate including a plurality of transmission lines and an electronic device including such a transmission line substrate.

2. Description of the Related Art

Conventionally, a transmission line substrate in which a stacked body obtained by stacking a plurality of insulating base materials includes a plurality of transmission lines has been known.

For example, International Publication No. 2013/103130 discloses a transmission line substrate provided with a first transmission line and a second transmission line that have a stripline structure and that are disposed in a stacking direction of a plurality of insulating base materials. In this transmission line substrate, a first ground conductor, a first signal line, an intermediate ground conductor, a second signal line, and a second ground conductor are respectively provided on different insulating base materials. The first transmission line is configured by the first ground conductor, the first signal line, and the intermediate ground conductor, and the second transmission line is configured by the intermediate ground conductor, the second signal line, and the second ground conductor.

However, in the structure of the transmission line substrate disclosed in International Publication No. 2013/103130, an insulating base material among the plurality of insulating base materials includes a large plane shaped ground conductor (in particular, the intermediate ground conductor provided between the first signal line and the second signal line in the stacking direction of the plurality of insulating base materials). In general, joining strength between an insulating base material and a conductor is weaker than joining strength between insulating base materials. Therefore, the joining strength between the insulating base material on which the ground conductor is provided and an insulating base material other than the insulating base material is reduced, so that the insulating base materials of a stacked body become easily separated from each other. As a result, the strength and durability of the transmission line substrate itself may be insufficient in some cases.

SUMMARY OF THE INVENTION

Preferred embodiments of the present invention provide transmission line substrates that achieve improved mechanical strength and durability against an external force and the like by significantly reducing or preventing separation of insulating base materials included in a stacked body from each other, in a structure in which the stacked body obtained by stacking a plurality of insulating base materials includes a plurality of transmission lines.

A transmission line substrate according to a preferred embodiment of the present invention includes a stacked body that includes a primary surface and includes a plurality of insulating base materials stacked on each other; a first signal line that is provided on any one of the plurality of insulating base materials; a second signal line that is provided on any one of the plurality of insulating base materials; a first ground conductor that is provided on any one of the plurality of insulating base materials; a second ground conductor that is provided on any one of the plurality of insulating base materials; a first interlayer connection conductor that is provided in any one of the plurality of insulating base materials; a plurality of first external connection electrodes that are provided on the primary surface and connected to the first signal line; a plurality of second external connection electrodes that are provided on the primary surface and connected to the second signal line; a first transmission line including the first signal line, the first ground conductor, and an insulating base material among the plurality of insulating base materials, the insulating base material being interposed between the first signal line and the first ground conductor; and a second transmission line including the second signal line, the second ground conductor, and an insulating base material among the plurality of insulating base materials, the insulating base material being interposed between the second signal line and the second ground conductor, and the stacked body has an elongated shape that extends in a transmission direction in which the first signal line and the second signal line extend; the second signal line is provided on a layer different from a layer on which the first signal line is provided and extends in parallel or substantially in parallel with the first signal line when viewed in a stacking direction in which the plurality of insulating base materials are stacked; the first ground conductor is provided on the same layer as the layer on which the second signal line is provided, and is overlapped with the first signal line when viewed in the stacking direction; the second ground conductor is provided on the same layer as the layer on which the first signal line is provided, and is overlapped with the second signal line when viewed in the stacking direction; the first interlayer connection conductor electrically connects the first ground conductor and the second ground conductor; the plurality of first external connection electrodes are respectively disposed in a vicinity of opposite ends of the stacked body in the transmission direction; and the plurality of second external connection electrodes are respectively disposed in a vicinity of opposite ends of the stacked body in the transmission direction.

In this configuration, the first transmission line and the second transmission line are disposed in the width direction of the stacked body, and a large ground conductor is not provided over the approximately whole area of the insulating base material. In other words, in comparison with a case in which a large ground conductor is provided over the approximately whole area of the insulating base material, the joining surface between the insulating base materials is relatively large. Therefore, according to this configuration, a decrease in the strength of partially or wholly joining of the insulating base materials is significantly reduced or prevented, and the insulating base materials of the stacked body is significantly reduced or prevented from being separated from each other, so that a transmission line substrate of which the mechanical strength and the durability against an external force and the like are improved is able to be obtained.

In addition, with this configuration, since the ground conductor that defines the transmission line substrate is provided on the same layer as the layer on which the signal line is provided, in comparison with a case in which the signal line and the ground conductor are provided on different layers, the number of insulating base materials required to provide a plurality of transmission lines is able to be reduced. Therefore, according to this configuration, in the configuration in which a plurality of transmission lines are provided in the stacked body obtained by stacking a plurality of insulating base materials, in comparison with a case in which the signal line and the ground conductor are provided on different layers, a thin transmission line substrate is able to be obtained.

In the above preferred embodiment of the present invention, the transmission line substrate may preferably include a third ground conductor that is provided on any one of the plurality of insulating base materials, a fourth ground conductor that is provided on any one of the plurality of insulating base materials, a second interlayer connection conductor that is provided in any one of the plurality of insulating base materials, and a third interlayer connection conductor that is provided in any one of the plurality of insulating base materials, and the third ground conductor may preferably be provided on a layer different from a layer on which the second ground conductor is provided, and may preferably be disposed so as to face the first ground conductor across the first signal line with respect to the stacking direction; the fourth ground conductor may preferably be provided on a layer different from a layer on which the first ground conductor is provided, and may preferably be disposed so as to face the second ground conductor across the second signal line with respect to the stacking direction; the second interlayer connection conductor may preferably electrically connect the second ground conductor and the third ground conductor; and the third interlayer connection conductor may preferably electrically connect the first ground conductor and the fourth ground conductor.

In this configuration, the ground conductor is disposed in the surrounding three directions of the first signal line, and the first signal line is surrounded by the ground conductor over the surrounding three directions of the first signal line. In addition, in this configuration, the ground conductor is disposed in the surrounding three directions of the second signal line, and the second signal line is surrounded by the ground conductor over the surrounding three directions of the second signal line. Therefore, according to this configuration, sufficient isolation between the first signal line and the second signal line is ensured, and the effect of reducing cross talk is enhanced.

In at least one of the above preferred embodiments of the present invention, the transmission line substrate may preferably include a fifth ground conductor that is provided on any one of the plurality of insulating base materials, and a sixth ground conductor that is provided on any one of the plurality of insulating base materials, and the fifth ground conductor may preferably be provided on the same layer as a layer on which the first signal line and the second ground conductor are provided, may preferably extend in parallel or substantially in parallel with the first signal line, and may preferably be disposed opposite to the second ground conductor with respect to the first signal line; and the sixth ground conductor may preferably be provided on the same layer as a layer on which the second signal line and the first ground conductor are provided, may preferably extend in parallel or substantially in parallel with the second signal line, and may preferably be disposed opposite to the first ground conductor with respect to the second signal line.

In this configuration, the ground conductor is disposed in the surrounding four directions of the first signal line, and the first signal line is surrounded by the ground conductor over the surrounding four directions of the first signal line. In addition, in this configuration, the ground conductor is disposed in the surrounding four directions of the second signal line, and the second signal line is surrounded by the ground conductor over the surrounding four directions of the second signal line. Therefore, according to this configuration, sufficient isolation between the first signal line and the second signal line is ensured, and the effect of reducing cross talk is further enhanced.

In at least one of the above preferred embodiments of the present invention, each of the plurality of insulating base materials may preferably be made of a thermoplastic resin.

According to this configuration, a transmission line substrate of which the shape is able to be easily plastically processed according to a mounting state is able to be obtained.

In at least one of the above preferred embodiments of the present invention, the first transmission line and the second transmission line may preferably include a bent portion that is bent in the stacking direction.

In at least one of the above preferred embodiments of the present invention, the stacked body may preferably have flexibility.

With such a configuration, the features of various preferred embodiments of the present invention work more effectively.

In at least one of the above preferred embodiments of the present invention, the transmission line substrate may preferably further include a ground conductor on the primary surface, the ground conductor being overlapped with all signal lines when viewed in the stacking direction.

With this configuration, unnecessary radiation from all the signal lines is significantly reduced or prevented more reliably.

In at least one of the above preferred embodiments of the present invention, the transmission line substrate may preferably include a first intermediate ground conductor that is provided between the layer on which the first signal line is provided and the layer on which the second signal line is provided, with respect to the stacking direction, and the first intermediate ground conductor may preferably be disposed between the first signal line and the second signal line when viewed in the stacking direction.

According to this configuration, the isolation between the first signal line and the second signal line is further increased, and the effect of reducing cross talk is further enhanced.

In at least one of the above preferred embodiments of the present invention, the first intermediate ground conductor may preferably be spaced farther apart from the first signal line or the second signal line than at least one of other ground conductors.

According to this configuration, the isolation between the first signal line and the second signal line is able to be increased without greatly affecting capacitance to be generated between the first signal line and the other ground conductors.

In at least one of the above preferred embodiments of the present invention, the first intermediate ground conductor, when viewed in the stacking direction, may preferably include a portion that, when viewed in the stacking direction, extends farther toward the first signal line than to the second ground conductor and is not overlapped with the second ground conductor.

According to this configuration, since the first intermediate ground conductor is disposed closer to the first signal line, the magnetic field to be generated around the first signal line is effectively shielded, and the isolation between the first signal line and the second signal line is able to be further increased.

In at least one of the above preferred embodiments of the present invention, the first intermediate ground conductor, when viewed in the stacking direction, may preferably include a portion that, when viewed in the stacking direction, extends farther toward the second signal line than to the first ground conductor and is not overlapped with the first ground conductor.

According to this configuration, since the first intermediate ground conductor is disposed closer to the second signal line, the magnetic field to be generated around the second signal line is effectively shielded, and the isolation between the first signal line and the second signal line is able to be further increased.

In at least one of the above preferred embodiments of the present invention, the first intermediate ground conductor may preferably have a thickness smaller in the stacking direction than a thickness of the other ground conductors.

Since the first intermediate ground conductor is disposed at position that is overlapped with a large number of conductors in the stacking direction, irregularities are easily formed on the surface of the transmission line substrate after the stacked body is obtained. However, according to this configuration, irregularities are able to be significantly reduced or prevented from being formed on the surface of the transmission line substrate.

In at least one of the above preferred embodiments of the present invention, the transmission line substrate may preferably include a third signal line that extends in parallel or substantially in parallel with the second signal line, and the third signal line may preferably be disposed at the same position as the second signal line in the stacking direction; the third signal line may preferably be disposed opposite to the second signal line across the first ground conductor in a width direction that is perpendicular or substantially perpendicular to the stacking direction and a parallel direction in which signal lines extend in parallel or substantially in parallel with each other; and the third signal line may preferably be disposed at a position symmetric to the second signal line with respect to a reference plane that extends through a center in a width direction of the first ground conductor and is in parallel or substantially in parallel to the parallel direction and the stacking direction.

With this configuration, since the second signal line and the third signal line are symmetrically disposed in the width direction of the stacked body, the physical and electromagnetic balance in the width direction in the stacked body is improved.

In at least one of the above preferred embodiments of the present invention, the transmission line substrate may preferably include a third transmission line that includes the third signal line, and the third transmission line and the second transmission line may preferably be disposed at positions symmetric to each other with respect to the reference plane.

With this configuration, since the second transmission line and the third transmission line are symmetrically disposed in the width direction of the stacked body, the physical and electromagnetic balance in the width direction in the stacked body is improved.

In at least one of the above preferred embodiments of the present invention, the transmission line substrate may preferably include a fourth signal line that extends in parallel or substantially in parallel with the first signal line, and the fourth signal line may preferably be disposed at a position symmetric to the first signal line with reference to the first ground conductor in the stacking direction.

With this configuration, since the first signal line and the fourth signal line are symmetrically disposed in the stacking direction of the stacked body, the structural balance in the stacking direction in the stacked body is improved and the electromagnetic balance is also improved. Therefore, the occurrence of uneven irregularities of the transmission line substrate is significantly reduced or prevented, and the mounting performance of the transmission line substrate to be mounted on a circuit board or the like is improved. In addition, a warp in the stacking direction of the transmission line substrate is significantly reduced or prevented from occurring.

In at least one of the above preferred embodiments of the present invention, the transmission line substrate may preferably include a fourth transmission line that includes the fourth signal line, and the fourth transmission line and the first transmission line may preferably be disposed at positions symmetric to each other with reference to the first ground conductor.

With this configuration, since the first transmission line and the fourth transmission line are symmetrically disposed in the stacking direction of the stacked body, the physical and electromagnetic balance in the stacking direction in the stacked body is improved.

In at least one of the above preferred embodiments of the present invention, the transmission line substrate may preferably include transmission lines of a predetermined number, and the transmission lines of a predetermined number may preferably include five or more transmission lines that include the first transmission line to the fourth transmission line, and the transmission lines of a predetermined number may preferably be symmetrically disposed in the stacking direction and a first direction perpendicular or substantially perpendicular to the stacking direction.

With this configuration, since all the transmission lines in the stacked body are symmetrically disposed, the physical and electromagnetic balance is further improved.

An electronic device includes a transmission line substrate according to any one of the above described preferred embodiments of the present invention, and a circuit board on which the transmission line substrate is surface-mounted.

With this configuration, an electronic device of which the reliability is improved and in which the electromagnetic coupling between the transmission line substrate and the circuit board is significantly reduced or prevented is achieved.

In the electronic device according to the above-described preferred embodiment, the circuit board may preferably include a mounting surface; the first signal line may preferably be disposed closer to the mounting surface than the second signal line is; the transmission line substrate may preferably include a second intermediate ground conductor that is provided between the mounting surface and the layer on which the first signal line is provided, with respect to the stacking direction; and the second intermediate ground conductor may preferably be disposed between the first signal line and the second signal line when viewed in the stacking direction.

According to this configuration, a magnetic field that is generated around the first signal line significantly reduces or prevents the first signal line and a conductor that is provided in contact with the circuit board from being coupled to each other.

In an electronic device according to at least one of the above-described preferred embodiments of the present invention, the second intermediate ground conductor may preferably be spaced farther apart from the first signal line than at least one of the other ground conductors.

According to this configuration, the coupling between the first signal line and the conductor that is provided in contact with the circuit board is able to be significantly reduced or prevented without greatly affecting capacitance to be generated between the first signal line and the other ground conductors.

In an electronic device according to at least one of the above-described preferred embodiments of the present invention, the second intermediate ground conductor may preferably include a portion that, when viewed in the stacking direction, extends farther toward the first signal line than to the second ground conductor and is not overlapped with the second ground conductor.

With this configuration, since the second intermediate ground conductor is disposed closer to the first signal line, the magnetic field to be generated around the first signal line is effectively shielded, and the coupling between the first signal line and the conductors provided in contact with the circuit board is able to be significantly reduced or prevented.

In an electronic device according to at least one of the above-described preferred embodiments of the present invention, the second intermediate ground conductor may preferably have a thickness smaller in the stacking direction than a thickness of the other ground conductors.

Since the second intermediate ground conductor is disposed at position that is overlapped with a large number of conductors in the stacking direction, irregularities are easily formed on the surface of the transmission line substrate after the stacked body is obtained. However, according to this configuration, irregularities are able to be significantly reduced or prevented from being formed on the surface of the multilayer substrate.

According to various preferred embodiments of the present invention, in a configuration in which a stacked body obtained by stacking a plurality of insulating base materials includes a plurality of transmission lines, it is possible to provide a transmission line substrate of which the mechanical strength and the durability against an external force and the like are improved by significantly reducing or preventing separation of the insulating base materials of the stacked body from each other.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4 includes cross-sectional diagrams sequentially showing steps for manufacturing a multilayer substrate 101A.

FIG. 5A is a perspective view of a multilayer substrate 102 according to a second preferred embodiment of the present invention and FIG. 5B is an exploded perspective view of the multilayer substrate 102.

DETAILED DESCRIPTION OF THE PREFERRED EMBODIMENTS

Figure 1A:
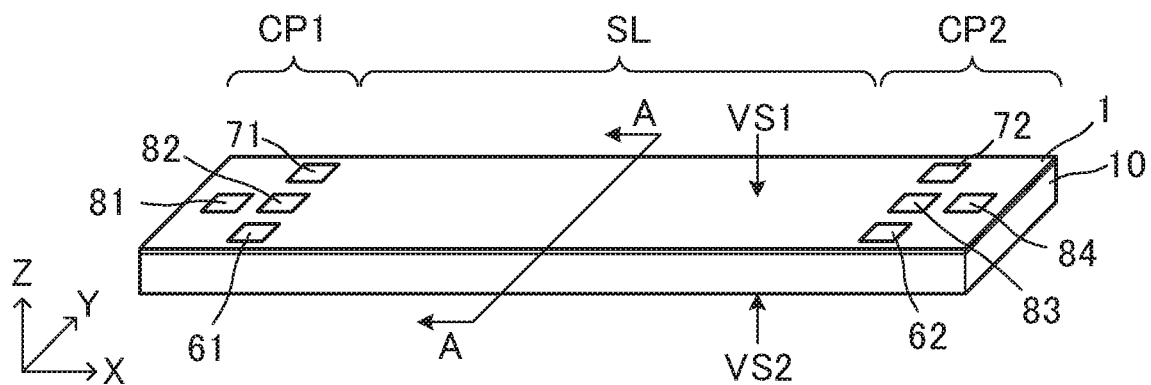
FIG. 1A is a perspective view of a multilayer substrate 101 according to a first preferred embodiment of the present invention.

Hereinafter, a plurality of preferred embodiments of the present invention will be described with reference to the attached drawings and several specific examples. In the drawings, the same components and elements are denoted by the same reference signs. While preferred embodiments are divided and described for the sake of convenience in consideration of ease of description or understanding of main points, elements described in different preferred embodiments are able to be partially replaced and combined with each other. In preferred embodiments after the second preferred embodiment, a description of features common to the first preferred embodiment will be omitted, and different features are primarily described. In particular, a description of similar operational effects achieved by similar structures will not be repeated in each preferred embodiment.

First Preferred Embodiment

Figure 1B:
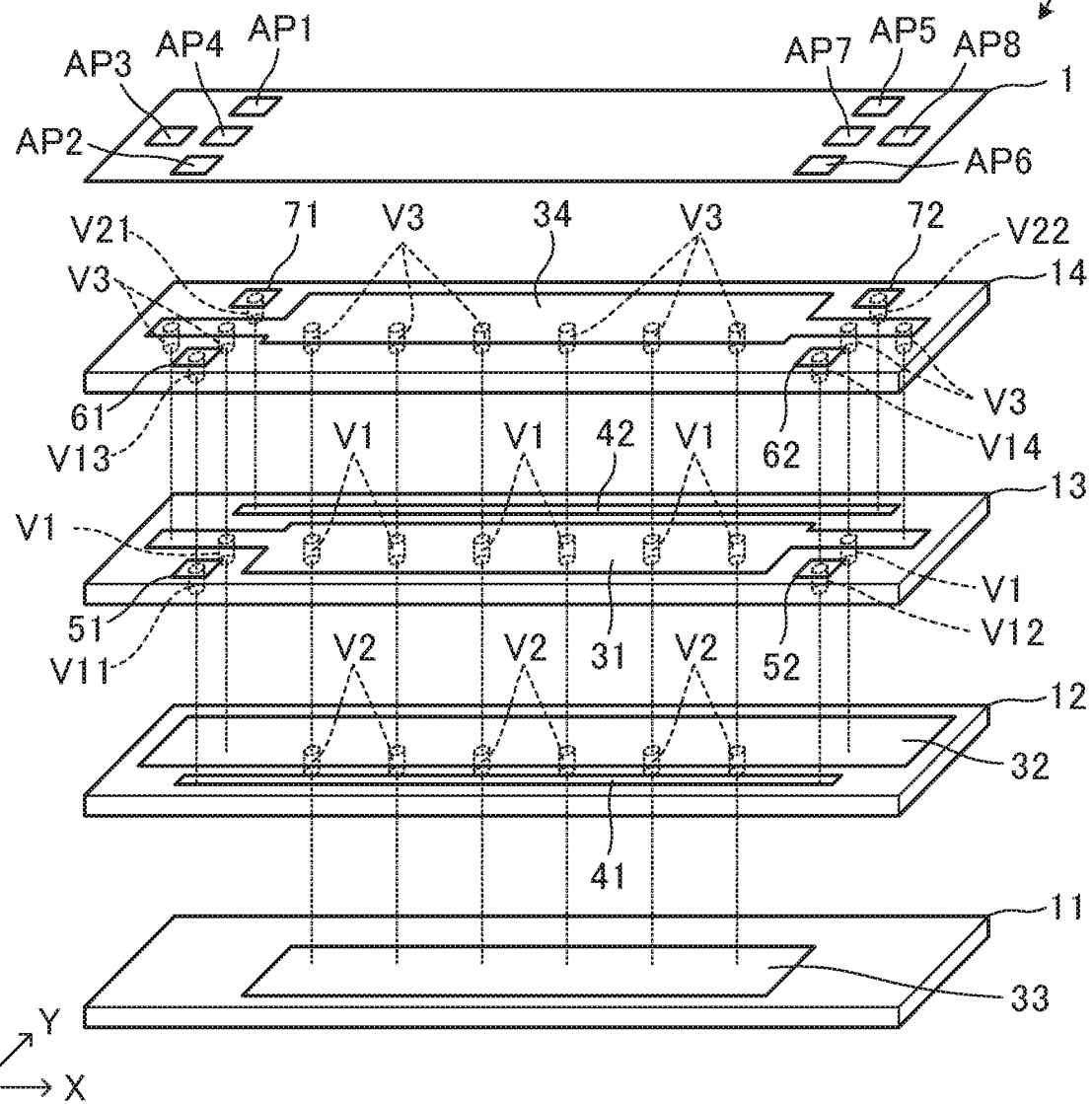
FIG. 1B is an exploded perspective view of the multilayer substrate 101.
Figure 2:
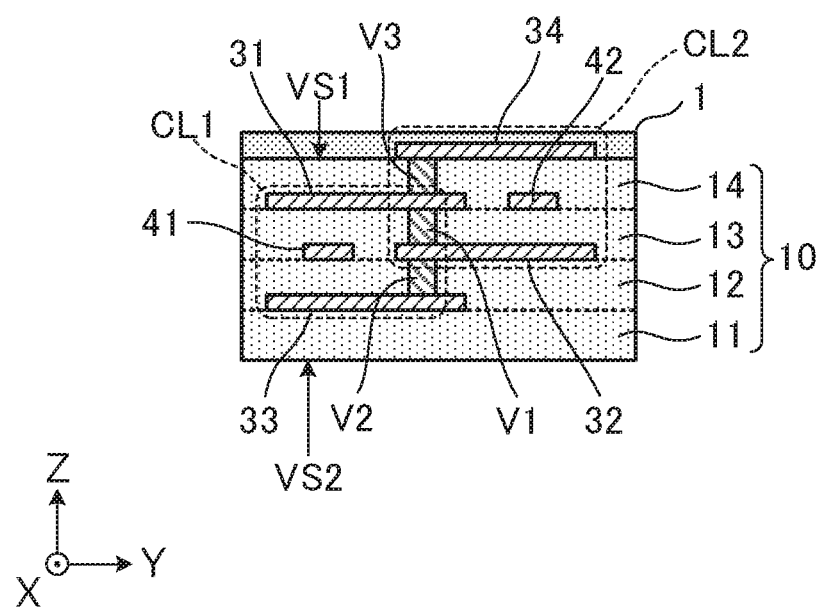
FIG. 2 is an A-A cross-sectional view of the multilayer substrate 101 in FIG. 1A.

FIG. 1A is a perspective view of a multilayer substrate 101 according to a first preferred embodiment of the present invention, and FIG. 1B is an exploded perspective view of the multilayer substrate 101. FIG. 2 is an A-A cross-sectional view of the multilayer substrate 101 in FIG. 1A. The multilayer substrate is a non-limiting example of a "transmission line substrate" according to various preferred embodiments of the present invention.

The multilayer substrate 101 includes a stacked body 10 obtained by stacking a plurality of insulating base materials 11, 12, 13, and 14, a conductor (such as a first signal line 41, a second signal line 42, a first ground conductor 31, a second ground conductor 32, a third ground conductor 33, a fourth ground conductor 34, a first interlayer connection conductor V1, a second interlayer connection conductor V2, and a third interlayer connection conductor V3) provided in any one of the plurality of insulating base materials 11, 12, 13, and 14, and a protective layer 1. As illustrated in FIG. 1A, the multilayer substrate 101 includes a line portion SL, a first connection portion CP1, and a second connection portion CP2.

The stacked body 10 has a rectangular or substantially rectangular parallelepiped shape having a longitudinal direction that coincides with the X-axis direction, and includes a first principal surface VS1 and a second primary surface VS2 that face each other. As illustrated in FIG. 1B, the stacked body 10 is obtained by stacking the insulating base materials 11, 12, 13, and 14 in this order. The protective layer 1 is provided on the first primary surface VS1 of the stacked body 10.

The plurality of insulating base materials 11, 12, 13, and 14 are each provided as a plate that includes a rectangular or substantially rectangular shape and a longitudinal direction that coincides with the X-axis direction. The plurality of insulating base materials 11, 12, 13, and 14 are plates made of a thermoplastic resin, for example, and are sheets made of a liquid crystal polymer as a primary material and having flexibility.

A third ground conductor 33 is provided on the surface of the insulating base material 11. The third ground conductor 33 is a rectangular or substantially rectangular conductor that is disposed closer to a first side (the lower side of the insulating base material 11 in FIG. 1B) than to the center of the insulating base material 11 and includes a longitudinal direction that coincides with the X-axis direction. The third ground conductor 33 is a conductor pattern made of a material such as a Cu foil, for example.

A first signal line 41 and a second ground conductor 32 are provided on the surface of the insulating base material 12. The first signal line 41 is a conductor that is disposed between a first side (the lower side of the insulating base material 12 in FIG. 1B) and the center of the insulating base material 12 and extends in the X-axis direction. The second ground conductor 32 is a rectangular or substantially rectangular conductor that is disposed closer to a second side (the upper side of the insulating base material 12) than to the center of the insulating base material 12 and includes a longitudinal direction that coincides with the X-axis direction. The first signal line 41 and the second ground conductor 32 are each a conductor pattern made of a material such as a Cu foil, for example.

In addition, the insulating base material 12 includes six second interlayer connection conductors V2, for example. The six second interlayer connection conductors V2 are conductors that are disposed in the center in the Y-axis direction of the insulating base material 12 and are arranged in the X-axis direction. As illustrated in FIG. 1B, the second interlayer connection conductors V2 electrically connect the second ground conductor 32 and the third ground conductor 33 to each other. The second interlayer connection conductors V2 are, for example, via conductors or through holes of which an inner wall is plated, or the like.

A second signal line 42, a first ground conductor 31, and first signal conductors 51 and 52 are provided on the surface of the insulating base material 13. The second signal line 42 is a conductor that is disposed closer to a second side (the upper side of the insulating base material 13 in FIG. 1B) than to the center of the insulating base material 13 and extends in the X-axis direction. The first ground conductor 31 is a conductor that is disposed between a first side (the lower side of the insulating base material 13) and the center of the insulating base material 13. The first signal conductor 51 is a rectangular or substantially rectangular shaped conductor disposed in the vicinity of a first end (the left end of the insulating base material 13 in FIG. 1B) of the insulating base material 13, and the first signal conductor 52 is a rectangular or substantially rectangular shaped conductor disposed in the vicinity of a second end (the right end of the insulating base material 13) of the insulating base material 13. The second signal line 42, the first ground conductor 31, and the first signal conductors 51 and 52 are each a conductor pattern made of a material such as a Cu foil, for example.

In addition, the insulating base material 13 includes eight first interlayer connection conductors V1 and interlayer connection conductors V11 and V12, for example. The eight first interlayer connection conductors V1 are conductors that are disposed in the center in the Y-axis direction of the insulating base material 13 and are arranged in the X-axis direction. The first interlayer connection conductors V1 electrically connect the first ground conductor 31 and the second ground conductor 32 to each other. The interlayer connection conductor V11 electrically connects the first signal conductor 51 and a first end (the left end of the first signal line 41 in FIG. 1B) of the first signal line 41 to each other. The interlayer connection conductor V12 electrically connects the first signal conductor 52 and a second end (the right end of the first signal line 41) of the first signal line 41 to each other. The first interlayer connection conductors V1 and the interlayer connection conductors V11 and V12 are, for example, via conductors or through holes of which an inner wall is plated, or the like.

A fourth ground conductor 34, first signal conductors 61 and 62, and second signal conductors 71 and 72 are provided on the surface of the insulating base material 14. The fourth ground conductor 34 is a conductor that is disposed between a second side (the upper side of the insulating base material 14 in FIG. 1B) and the center of the insulating base material 14. The first signal conductor 61 and the second signal conductor 71 are rectangular or substantially rectangular shaped conductors disposed in the vicinity of a first end (the left end of the insulating base material 14) of the insulating base material 14. The first signal conductor 62 and the second signal conductor 72 are rectangular or substantially rectangular shaped conductors disposed in the vicinity of a second end (the right end of the insulating base material 14)

of the insulating base material 14. The fourth ground conductor 34, the first signal conductors 61 and 62, and the second signal conductors 71 and 72 are each a conductor pattern made of a material such as a Cu foil, for example.

In addition, the insulating base material 14 includes 10 third interlayer connection conductors V3 and interlayer connection conductors V13, V14, V21, and V22. The 10 third interlayer connection conductors V3 are conductors that are disposed in the center in the Y-axis direction of the insulating base material 14 and are arranged in the X-axis direction. The third interlayer connection conductors V3 electrically connect the first ground conductor 31 and the fourth ground conductor 34 to each other. The interlayer connection conductor V13 electrically connects the first signal conductor 61 and the first signal conductor 51 to each other, and the interlayer connection conductor V14 electrically connects the first signal conductor 62 and the first signal conductor 52 to each other. The interlayer connection conductor V21 electrically connects the second signal conductor 71 and a first end (the left end of the second signal line 42 in FIG. 1B) of the second signal line 42 to each other. The interlayer connection conductor V22 electrically connects the second signal conductor 72 and a second end (the right end of the second signal line 42) of the second signal line 42 to each other. The third interlayer connection conductors V3 and the interlayer connection conductors V13, V14, V21, and V22 are, for example, via conductors or through holes of which an inner wall is plated, or the like.

The protective layer 1 includes the same or substantially the same shape in a plan view as the insulating base material 14, and is provided on the upper surface of the insulating base material 14. The protective layer 1 includes opening portions AP2 and AP6 at positions corresponding to the positions of the first signal conductors 61 and 62, and includes opening portions AP1 and AP5 at positions corresponding to the positions of the second signal conductors 71 and 72. In addition, the protective layer 1 includes opening portions AP3 and AP4 at positions in the vicinity of the opening portions AP1 and AP2 and corresponding to the position of the fourth ground conductor 34. Further, the protective layer 1 includes opening portions AP7 and AP8 at positions in the vicinity of the opening portions AP5 and AP6 and corresponding to the position of the fourth ground conductor 34. The protective layer 1 is a solder resist film, for example.

Therefore, even when the protective layer 1 is provided on the first primary surface VS1 of the stacked body 10 (that is, the protective layer 1 is stacked on the upper surface of the insulating base material 14), the first signal conductors 61 and 62, the second signal conductors 71 and 72, and a portion of the fourth ground conductor 34 (ground conductors 81, 82, 83, and 84 in FIG. 1A) are exposed on the first primary surface VS1 of the stacked body 10. In the first preferred embodiment, each of the first signal conductors 61 and 62 corresponds to a "first external connection electrode", and each of the second signal conductors 71 and 72 corresponds to a "second external connection electrode".

In the first preferred embodiment, the first connection portion CP1 is provided in the vicinity of the first end (the left end of the stacked body 10 in FIG. 1A) of the rectangular or substantially rectangular parallelepiped-shaped stacked body 10 in which the first signal conductor 61, the second signal conductor 71, and the ground conductors 81 and 82 are provided. In addition, in the first preferred embodiment, the second connection portion CP2 is provided in the vicinity of the second end (the right end of the stacked body 10) of the stacked body 10 in which the first signal conductor 62, the second signal conductor 72, and the ground conductors 83 and 84 are provided. In other words, the multilayer substrate 101 includes the first connection portion CP1, the line portion SL, and the second connection portion CP2 that are disposed in this order in the X-axis direction.

As illustrated in FIG. 1B, FIG. 2, and other drawings, the second signal line 42 is provided on a layer different from the layer on which the first signal line 41 is provided, and extends in parallel or substantially in parallel with the first signal line 41 when viewed in the stacking direction (the Z-axis direction) of the plurality of insulating base materials 11, 12, 13, and 14.

In addition, as illustrated in FIG. 2 and other drawings, the first ground conductor 31 is provided on the same layer as the layer on which the second signal line 42 is provided, and is overlapped with the first signal line 41 when viewed in the Z-axis direction. The second ground conductor 32 is provided on the same layer as the layer on which the first signal line 41 is provided, and is overlapped with the second signal line 42 when viewed in the Z-axis direction.

Further, as illustrated in FIG. 2 and other drawings, the third ground conductor 33 is provided on a layer different from the layer on which the second ground conductor 32 is provided, and is disposed to face the first ground conductor 31 across the first signal line 41 with respect to the Z-axis direction. The fourth ground conductor 34 is provided on a layer different from the layer on which the first ground conductor 31 is provided, and is disposed to face the second ground conductor 32 across the second signal line 42 with respect to the Z-axis direction.

In the first preferred embodiment, as illustrated in FIG. 2, the first signal line 41, the first ground conductor 31, the third ground conductor 33, the insulating base material 13 interposed between the first signal line 41 and the first ground conductor 31, and the insulating base material 12 interposed between the first signal line 41 and the third ground conductor 33 define a first transmission line CL1. In addition, in the first preferred embodiment, the second signal line 42, the second ground conductor 32, the fourth ground conductor 34, the insulating base material 13 interposed between the second signal line 42 and the second ground conductor 32, and the insulating base material 14 interposed between the second signal line 42 and the fourth ground conductor 34 define a second transmission line CL2.

According to the multilayer substrate 101 according to the first preferred embodiment of the present invention, the following advantageous effects may be obtained.

In the multilayer substrate 101, the first transmission line CL1 and the second transmission line CL2 are disposed in the width direction (the Y-axis direction) of the stacked body 10, and a large ground conductor is not provided over the approximately whole area of the insulating base material. In other words, in comparison with a case in which a large ground conductor is provided over the approximately whole area of the insulating base material, the joining surface between the insulating base materials is relatively large. Therefore, with this configuration, a decrease in the strength of partially or wholly joining of the insulating base materials is significantly reduced or prevented, and, since the insulating base materials of the stacked body 10 are significantly reduced or prevented from being separated from each other, a multilayer substrate of which the mechanical strength and the durability against an external force and the like are improved is able to be obtained. In particular, in a case in which a stacked body having flexibility is used, interlayer separation during deformation is significantly reduced or prevented, and the configuration of the first preferred embodiment of the present invention provides greater advantageous effects.

In addition, in the first preferred embodiment, the first transmission line CL1 and the second transmission line CL2 are disposed in the Y-axis direction, and the ground conductor (the first ground conductor 31 or the second ground conductor 32) defining a transmission line is provided on the same layer as the layer on which the signal line (the first signal line 41 or the second signal line 42) is provided. Therefore, in comparison with a configuration (in a case in which the signal line and the ground conductor are provided on different layers) in which a plurality of transmission lines are disposed in the Z-axis direction, the number of insulating base materials required to provide a plurality of transmission lines is able to be reduced. Therefore, with this configuration, in the configuration in which a plurality of transmission lines are provided in the stacked body obtained by stacking a plurality of insulating base materials, in comparison with a case in which the signal line and the ground conductor are provided on different layers, a thin multilayer substrate is able to be obtained.

In addition, since the ground conductor (the first ground conductor 31 or the second ground conductor 32) is provided on the same layer as the layer on which the signal line (the first signal line 41 or the second signal line 42) is provided, in comparison with a case in which the ground conductor is provided on a layer different from the layer on which the signal line is provided, isolation between first signal line 41 and second signal line 42 is able to be increased.

In the first preferred embodiment, as illustrated in FIG. 2 and other drawings, since the first interlayer connection conductor V1 is disposed between the signal lines (between the first signal line 41 and the second signal lines 42), the isolation between the signal lines is able to be increased. It is to be noted that, similarly to the multilayer substrate 101 according to the first preferred embodiment, a plurality of first interlayer connection conductors V1 provided between the signal lines are able to further increase the isolation. Further, in the first preferred embodiment, since the distance between the first ground conductor 31 and the second ground conductor 32 is small in the stacking direction, the occurrence of conductive failure of the first interlayer connection conductor V1 is significantly reduced or prevented.

In the first preferred embodiment, the ground conductors (the first ground conductor 31, the second ground conductor 32, the third ground conductor 33, the first interlayer connection conductor V1, and the second interlayer connection conductor V2) are disposed in the surrounding three directions (the positive Y direction, the positive Z direction, and the negative Z direction with respect to the first signal line 41 in FIG. 2) of the first signal line 41, and the first signal line 41 is surrounded by the ground conductors in the surrounding three directions. In addition, in the first preferred embodiment, the ground conductors (the first ground conductor 31, the second ground conductor 32, the fourth ground conductor 34, the first interlayer connection conductor V1, and the third interlayer connection conductor V3) are disposed in the surrounding three directions (the negative Y direction, the positive Z direction, and the negative Z direction with respect to the second signal line 42 in FIG. 2) of the second signal line 42, and the second signal line 42 is surrounded by the ground conductors in the surrounding three directions. Therefore, with this configuration, sufficient isolation between the first signal line 41 and the second signal line 42 is ensured, and the effect of reducing cross talk is enhanced.

In the first preferred embodiment, the plurality of insulating base materials 11, 12, 13, and 14 that define the stacked body 10 are each made of thermoplastic resin in the present preferred embodiment, respectively. With this configuration, as described in detail below, a multilayer substrate of which the shape is able to be plastically processed easily according to a mounted state (such as irregularities of a mounting destination) is able to be obtained.

Figure 3:
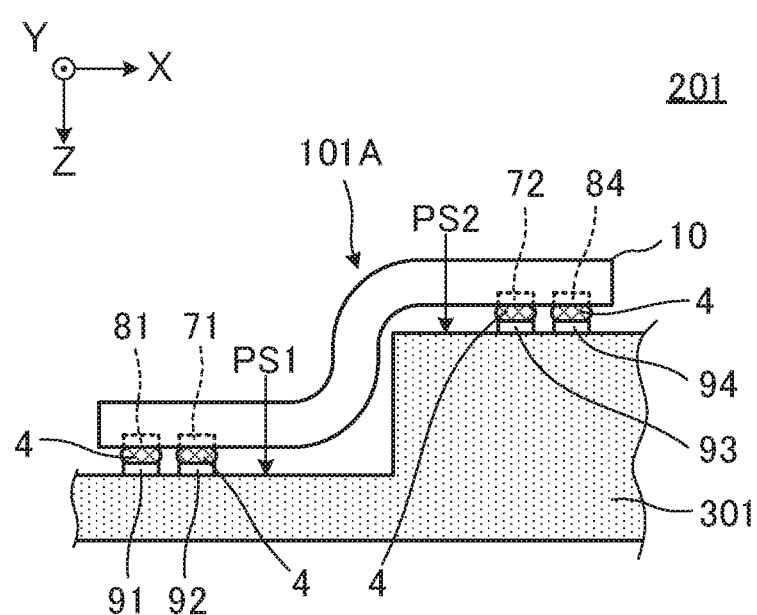
FIG. 3 is a cross-sectional view of a main portion of an electronic device 201 according to the first preferred embodiment of the present invention.

Subsequently, an example of mounting a multilayer substrate according to a preferred embodiment of the present invention will be described with reference to the drawings. FIG. 3 is a cross-sectional view of a main portion of an electronic device 201 according to the first preferred embodiment of the present invention.

The electronic device 201 according to the first preferred embodiment includes a multilayer substrate 101A and a circuit board 301. The multilayer substrate 101A is different from the multilayer substrate 101 in that the first transmission line and the second transmission line of the multilayer substrate 101A include a bent portion (to be described in detail later) bent in the Z-axis direction. Other configurations are substantially the same as the configurations of the multilayer substrate 101. The circuit board 301 includes a first surface PS1 and a second surface PS2. Both the first surface PS1 and the second surface PS2 are surfaces in parallel or substantially parallel to the XY plane, and are surfaces located at different heights in the Z-axis direction.

As illustrated in FIG. 3, the multilayer substrate 101A is mounted on the circuit board 301. The first surface PS1 of the circuit board 301 includes conductors 91 and 92 and the like and the second surface PS2 of the circuit board 301 includes conductors 93 and 94 and the like. The ground conductor 81, the second signal conductor 71, and the like of the multilayer substrate 101A are respectively connected to the conductors 91 and 92 and the like provided on the first surface PS1 through a conductive joining material 4 such as solder. The second signal conductor 72 and the ground conductor 84 and the like of the multilayer substrate 101A are respectively connected to the conductors 93 and 94 and the like provided on the second surface PS2 through a conductive joining material 4 such as solder. Although not shown, the first signal conductor is also connected to the conductor provided on the surface of the circuit board 301.

As described above, the multilayer substrate 101A (the first transmission line and the second transmission line), since including the bent portion bent in the Z-axis direction, is easily mounted on the circuit board 301 including surfaces located at different heights in the Z-axis direction.

The multilayer substrate 101A according to the first preferred embodiment is manufactured by, for example, the following steps. FIG. 4 includes cross-sectional diagrams sequentially showing steps for manufacturing the multilayer substrate 101A.

(1) First, an insulating base material layer (thermoplastic resin) in a collective substrate state and a protective layer, the insulating base material layer being obtained by patterning a signal line, a ground conductor, and the like, are stacked to define a stacked body in a collective substrate state, then the stacked body in the collective substrate state is divided to an individual element, and a multilayer substrate 101 illustrated in step (1) in FIG. 4 is obtained.

(2) Subsequently, as illustrated in step (2) in FIG. 4, the first primary surface VS1 and the second primary surface VS2 of the stacked body 10 are heated and pressurized in the Z-axis direction (see the arrows in FIG. 4), by using an upper mold 5 and a lower mold 6. It is to be noted that the positions to be heated and pressurized are in the vicinity of the center in the longitudinal direction (the X-axis direction) of the stacked body 10, as illustrated in FIG. 4. The upper mold 5 and the lower mold 6 includes a structure with an L-shaped or substantially L-shaped cross section.

After the thermoplastic resin of the stacked body 10 is cooled and solidified, the stacked body 10 is removed from the upper mold 5 and the lower mold 6, and a multilayer substrate 101A is obtained. With such a manufacturing method, it is possible to obtain a multilayer substrate 101A of which the bent shape is maintained (retained).

As described above, the shape of the multilayer substrate 101 according to the first preferred embodiment of the present invention is able to be plastically processed easily according to a mounted state (such as irregularities of a mounting destination) since the insulating base materials of the stacked body 10 are made of thermoplastic resin.

It is to be noted that, while the first preferred embodiment of the present invention provides an example of a multilayer substrate including a bent portion bent in the Z-axis direction in the vicinity of the center in the longitudinal direction (the X-axis direction) of the stacked body 10, the present invention is not limited to such a configuration. The multilayer substrate may include a structure with a bent portion bent in the X-axis direction or the Y-axis direction. In addition, the multilayer substrate may include a structure with a bent portion at a position (a position between the first connection portion CP1 and the center in the longitudinal direction of the stacked body 10, for example) other than the center in the longitudinal direction (the X-axis direction) of the stacked body 10.

In addition, while the first preferred embodiment of the present provides an example in which a conductor (the first signal conductors 61 and 62, the second signal conductors 71 and 72, and the ground conductors 81, 82, 83, and 84) is provided on the first connection portion CP1 and the second connection portion CP2 of the multilayer substrate 101, the present invention is not limited to this example. A connector may be mounted on the first connection portion CP1 and the second connection portion CP2 of the multilayer substrate.

Second Preferred Embodiment

A second preferred embodiment of the present invention describes a multilayer substrate including a stacked body 10A obtained by stacking two insulating base materials and a protective layer.

Figure 6:
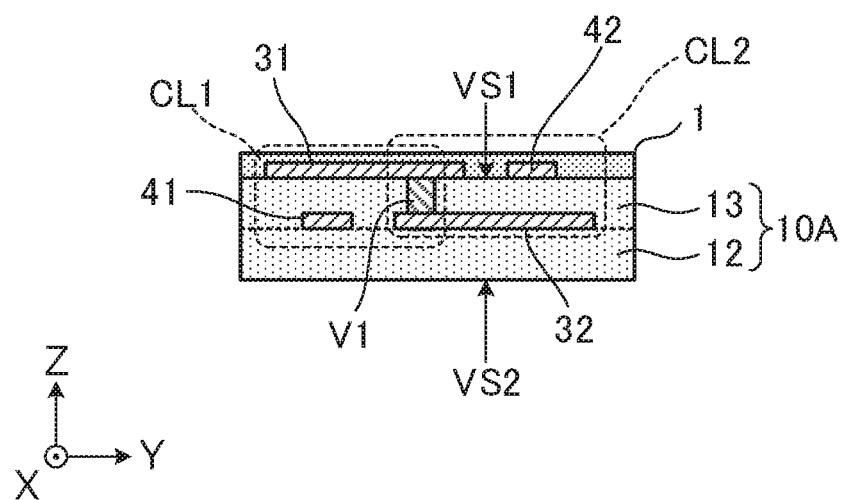
FIG. 6 is a B-B cross-sectional view of the multilayer substrate 102 in FIG. 5A.

FIG. 5A is a perspective view of a multilayer substrate 102 according to the second preferred embodiment of the present invention and FIG. 5B is an exploded perspective view of the multilayer substrate 102. FIG. 6 is a B-B cross-sectional view of the multilayer substrate 102 in FIG. 5A.

The multilayer substrate 102 includes a stacked body 10A obtained by stacking a plurality of insulating base materials 12 and 13, a conductor provided on any one of the plurality of insulating base materials 12 and 13, and a protective layer 1. The stacked body 10A, as illustrated in FIG. 5B, is obtained by stacking the two insulating base materials 12 and 13 in this order. The stacked body 10A further includes the protective layer 1 provided on the first primary surface VS1 of the stacked body 10A.

A first signal line 41 and a second ground conductor 32 are provided on the surface of the insulating base material 12. The configurations of the first signal line 41 and the second ground conductor 32 are the same or substantially the same as the configurations according to the first preferred embodiment. It is to be noted that a second interlayer connection conductor (the second interlayer connection conductor V2 in FIG. 1B) is not provided in the insulating base material 12 according to the second preferred embodiment.

A second signal line 42, a first ground conductor 31, and first signal conductors 51 and 52 are provided on the surface of the insulating base material 13. In addition, the insulating base material 13 includes eight first interlayer connection conductors V1 and interlayer connection conductors V11 and V12, for example. The configurations of the second signal line 42, the first ground conductor 31, the first signal conductors 51 and 52, the first interlayer connection conductor V1, and the interlayer connection conductors V11 and V12 are the same or substantially the same as the configurations according to the first preferred embodiment.

The protective layer 1 includes the same or substantially the same shape in a plan view as the insulating base material 13, and is provided on the upper surface of the insulating base material 13. The protective layer 1 includes opening portions AP2 and AP6 at positions corresponding to the positions of the first signal conductors 51 and 52, and includes opening portions AP1 and AP5 at positions corresponding to the positions of the first end and second end of the second signal line 42. In addition, the protective layer 1 includes opening portions AP3 and AP4 at positions in the vicinity of the opening portions AP1 and AP2 and corresponding to the position of the first ground conductor 31. Further, the protective layer 1 includes opening portions AP7 and AP8 at positions in the vicinity of the opening portions AP5 and AP6 and corresponding to the position of the first ground conductor 31.

Therefore, even when the protective layer 1 is provided on the upper surface of the insulating base material 13, the first signal conductors 51 and 52, a portion of the second signal line (the second signal conductors 73 and 74 in FIG. 5A), and a portion of the first ground conductor 31 (ground conductors 85, 86, 87, and 88) are exposed on the first primary surface VS1 of the stacked body 10A. In the second preferred embodiment, each of the first signal conductors 51 and 52 corresponds to a "first external connection electrode", and each of the second signal conductors 73 and 74 in FIG. 5A corresponds to a "second external connection electrode".

In the second preferred embodiment, as illustrated in FIG. 6, the first signal line 41, the first ground conductor 31, and the insulating base material 13 interposed between the first signal line 41 and the first ground conductor 31 defines a first transmission line CL1. In addition, in the second preferred embodiment, the second signal line 42, the second ground conductor 32, and the insulating base material 13 interposed between the second signal line 42 and the second ground conductor 32 defines a second transmission line CL2.

Since the number of insulating base materials defining a stacked body according to the second preferred embodiment is smaller than the number of insulating base materials of the stacked body 10 according to the first preferred embodiment, a multilayer substrate that is thinner than the multilayer substrate 101 according to the first preferred embodiment is able to be obtained. However, in terms of ensuring the isolation between the first transmission line CL1 and the second transmission line CL2, the configuration according to the first preferred embodiment is preferable.

It is to be noted that, while the first preferred embodiment of the present provides an example in which the first signal line 41 and the second ground conductor 32 are provided on the front surface of the insulating base material 12 and the second signal line 42 and the first ground conductor 31 provided on the front surface of the insulating base material 13, the present invention is not limited to such a configuration. For example, the second signal line 42 and the first ground conductor 31 may be provided on the front surface of the insulating base material 13, and the first signal line 41 and the second ground conductor 32 may be provided on the rear surface of the insulating base material 13.

Third Preferred Embodiment

A third preferred embodiment of the present invention describes a multilayer substrate further including a fifth ground conductor and a sixth ground conductor.

Figure 7A:
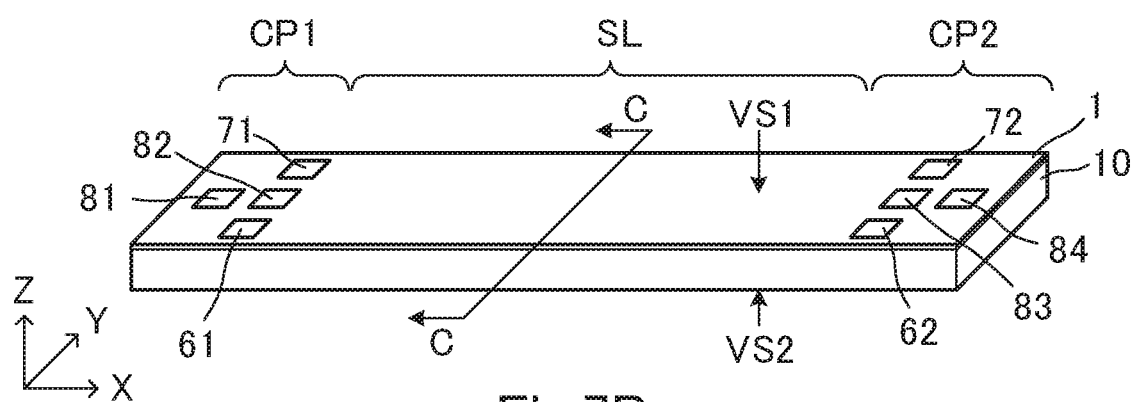
FIG. 7A is a perspective view of a multilayer substrate 103 according to a third preferred embodiment of the present invention and FIG. 7B is an exploded perspective view of a line portion SL of the multilayer substrate 103.
Figure 7B:
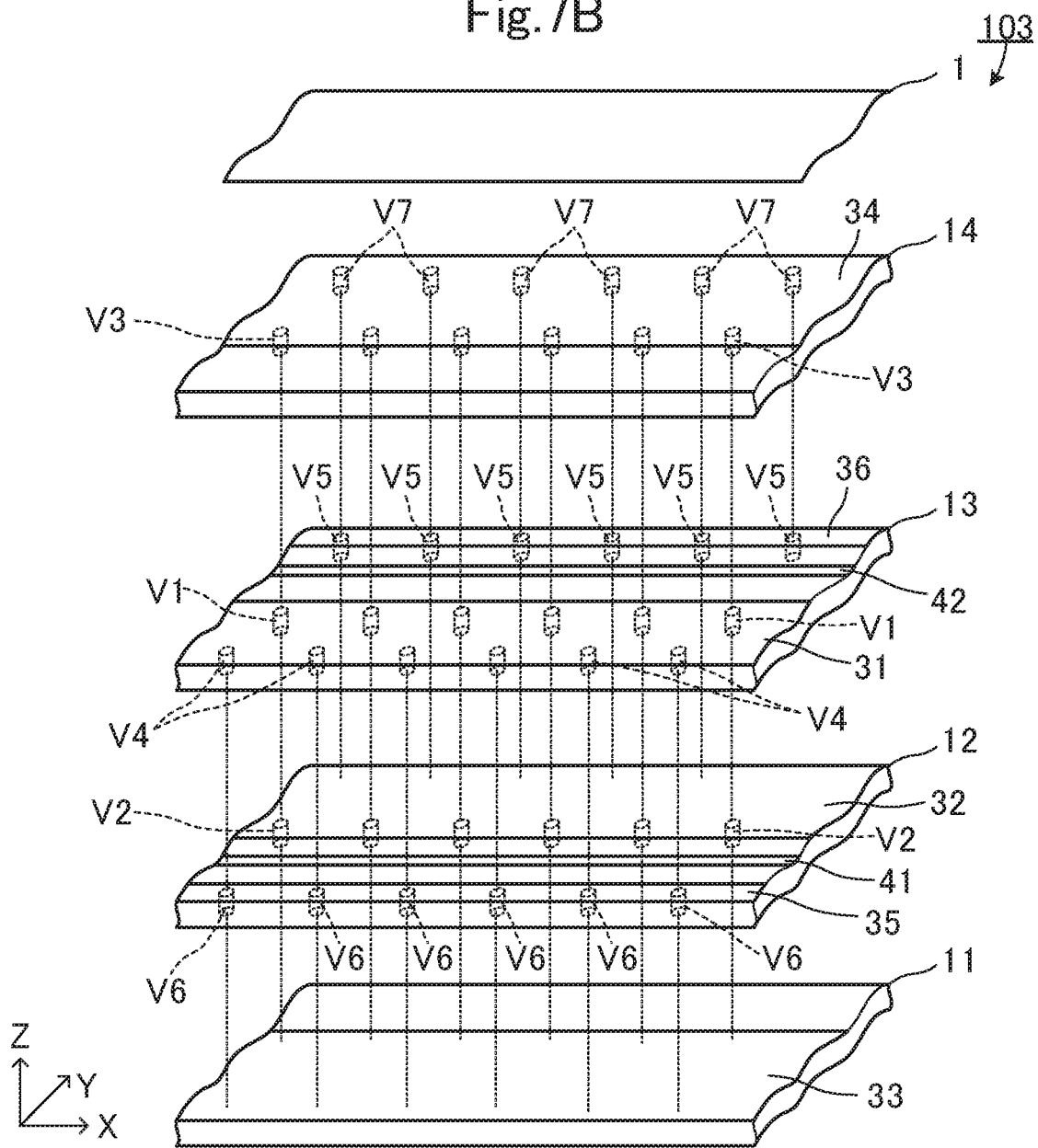
Figure 8:
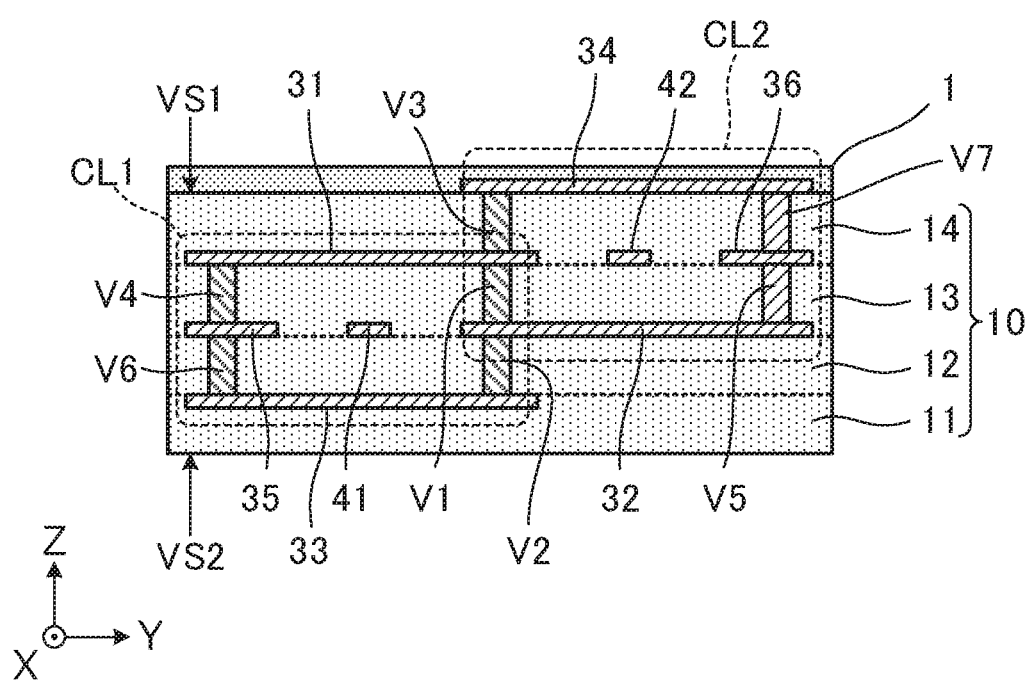
FIG. 8 is a C-C cross-sectional view of the multilayer substrate 103 in FIG. 7A.

FIG. 7A is a perspective view of a multilayer substrate 103 according to the third preferred embodiment of the present invention and FIG. 7B is an exploded perspective view of a line portion SL of the multilayer substrate 103. FIG. 8 is a C-C cross-sectional view of the multilayer substrate 103 in FIG. 7A.

The multilayer substrate 103 is different from the multilayer substrate 101 according to the first preferred embodiment in that the multilayer substrate 103 further includes a conductor (a fifth ground conductor 35, a sixth ground conductor 36, a fourth interlayer connection conductor V4, a fifth interlayer connection conductor V5, a sixth interlayer connection conductor V6, and a seventh interlayer connection conductor V7) provided in any one of the plurality of insulating base materials 11, 12, 13, and 14. Other configurations are substantially the same as the configurations of the multilayer substrate 101.

As illustrated in FIG. 7B, a first signal line 41, a second ground conductor 32, and a fifth ground conductor 35 are provided on the surface of the insulating base material 12. The fifth ground conductor 35 is a conductor that is disposed in the vicinity of the first side (the lower side of the insulating base material 12 in FIG. 7B) of the insulating base material 12 and extends in the X-axis direction. The fifth ground conductor 35 is a conductor pattern made of a material such as a Cu foil, for example.

In addition, the insulating base material 12 includes a plurality of second interlayer connection conductors V2, and a plurality of sixth interlayer connection conductors V6. The plurality of sixth interlayer connection conductors V6 are conductors that are disposed in the vicinity of the first side of the insulating base material 12 and are arranged in the X-axis direction. As illustrated in FIG. 7B, the sixth interlayer connection conductors V6 electrically connect the fifth ground conductor 35 and the third ground conductor 33 to each other. The sixth interlayer connection conductors V6 are, for example, via conductors or through holes of which an inner wall is plated, or the like.

A second signal line 42, a first ground conductor 31, a sixth ground conductor 36, and the like are provided on the surface of the insulating base material 13. The sixth ground conductor 36 is a conductor that is disposed in the vicinity of the second side (the upper side of the insulating base material 13 in FIG. 7B) of the insulating base material 13 and extends in the X-axis direction. The sixth ground conductor 36 is a conductor pattern made of a material such as a Cu foil, for example.

In addition, the insulating base material 13 includes a plurality of first interlayer connection conductors V1, a plurality of fourth interlayer connection conductors V4, and a plurality of fifth interlayer connection conductors V5. The fourth interlayer connection conductors V4 are conductors that are disposed in the vicinity of the first side (the lower side of the insulating base material 13 in FIG. 7B) of the insulating base material 13 and are arranged in the X-axis direction. The plurality of fifth interlayer connection conductors V5 are conductors that are disposed in the vicinity of the second side of the insulating base material 13 and are arranged in the X-axis direction. As illustrated in FIG. 7B, the fourth interlayer connection conductors V4 electrically connect the first ground conductor 31 and the fifth ground conductor 35 to each other. In addition, the fifth interlayer connection conductors V5 electrically connect the sixth ground conductor 36 and the second ground conductor 32 to each other. The fourth interlayer connection conductors V4 and the fifth interlayer connection conductors V5 are, for example, via conductors or through holes of which an inner wall is plated, or the like.

In addition, the insulating base material 14 includes a plurality of third interlayer connection conductors V3, and a plurality of seventh interlayer connection conductors V7. The seventh interlayer connection conductors V7 are conductors that are disposed in the vicinity of the second side (the upper side of the insulating base material 14 in FIG. 7B) of the insulating base material 14 and are arranged in the X-axis direction. The seventh interlayer connection conductors V7 electrically connect the fourth ground conductor 34 and the sixth ground conductor 36 to each other. The seventh interlayer connection conductors V7 are, for example, via conductors or through holes of which an inner wall is plated, or the like.

As illustrated in FIG. 7B and FIG. 8, the fifth ground conductor 35 is provided on the same layer as the layer on which the first signal line 41 and the second ground conductor 32 are provided. In addition, the fifth ground conductor 35 extends in parallel or substantially in parallel with the first signal line 41, and is disposed on an opposite side (the left side of the first signal line 41 in FIG. 8) away from the second ground conductor 32 with respect to the first signal line 41.

Further, as illustrated in FIG. 7B and FIG. 8, the sixth ground conductor 36 is provided on the same layer as the layer on which the second signal line 42 and the first ground conductor 31 are provided. In addition, the sixth ground conductor 36 extends in parallel or substantially in parallel with the second signal line 42, and is disposed on an opposite side (the right side of the second signal line 42 in FIG. 8) away from the first ground conductor 31 with respect to the second signal line 42.

According to the multilayer substrate 103 of the third preferred embodiment of the present invention, the following advantageous effects in addition to the advantageous effects that have been described in the first preferred embodiment may be obtained.

In the third preferred embodiment, the ground conductors (the first ground conductor 31, the second ground conductor 32, the third ground conductor 33, the fifth ground conductor 35, the first interlayer connection conductor V1, the second interlayer connection conductor V2, the fourth interlayer connection conductor V4, and the sixth interlayer connection conductor V6) are disposed in the surrounding four directions (the positive Y direction, the negative Y direction, the positive Z direction, and the negative Z direction with respect to the first signal line 41 in FIG. 8) of the first signal line 41, and the first signal line 41 is surrounded by the ground conductors in the surrounding four directions. In addition, in the third preferred embodiment, the ground conductors (the first ground conductor 31, the second ground conductor 32, the fourth ground conductor 34, the sixth ground conductor 36, the first interlayer connection conductor V1, the third interlayer connection conductor V3, the fifth interlayer connection conductor V5, and the seventh interlayer connection conductor V7) are disposed in the surrounding four directions (the positive Y direction, the negative Y direction, the positive Z direction, and the negative Z direction with respect to the second signal line 42 in FIG. 8) of the second signal line 42, and the second signal line 42 is surrounded by the ground conductors in the surrounding four directions. Therefore, with this configuration, the isolation between the first signal line 41 and the second signal line 42 is further increased, and the effect of reducing cross talk is enhanced.

Fourth Preferred Embodiment

A fourth preferred embodiment of the present invention describes a multilayer substrate with a structure in which a plurality of transmission lines are branched at the first connection portion and the second connection portion.

Figure 9:
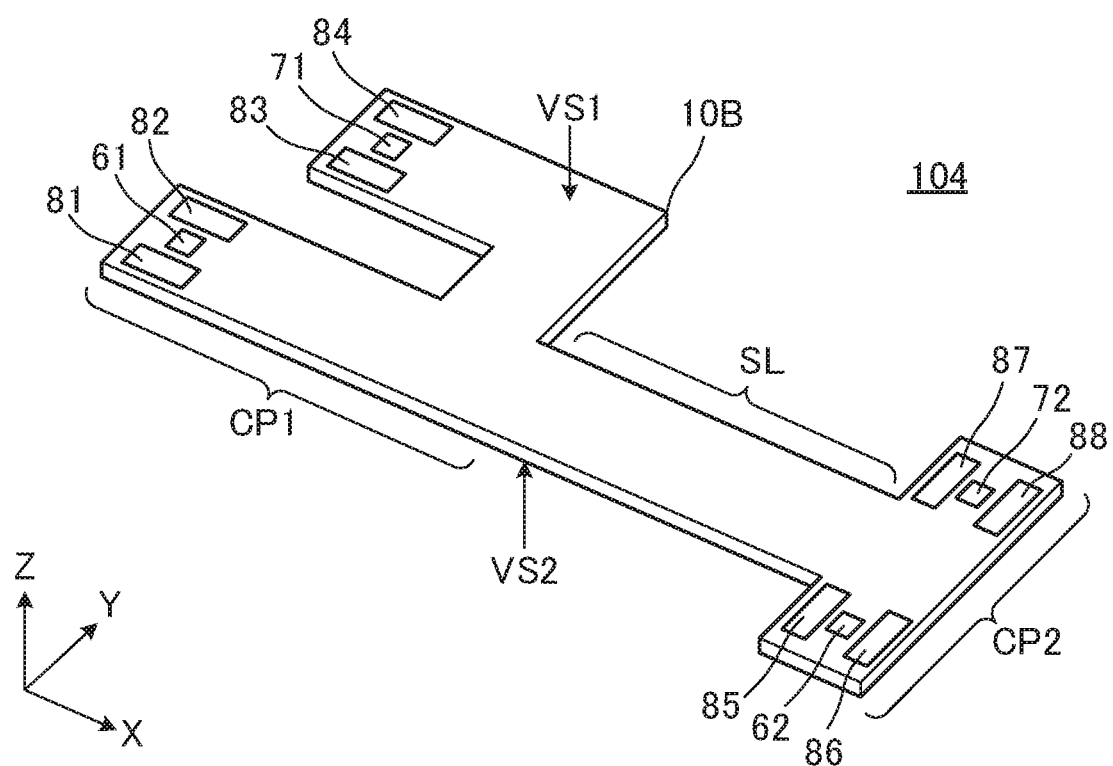
FIG. 9 is a perspective view of a multilayer substrate 104 according to a fourth preferred embodiment of the present invention.

FIG. 9 is a perspective view of a multilayer substrate 104 according to the fourth preferred embodiment of the present invention.

The multilayer substrate 104 includes a stacked body 10B obtained by stacking a plurality of insulating base materials, and a conductor provided on any one of the plurality of insulating base materials. The multilayer substrate 104 is different from the multilayer substrate 101 according to the first preferred embodiment in that the multilayer substrate 104 includes a first connection portion CP1 in which the first transmission line and the second transmission line are branched in a Y shape from the line portion SL, and a second connection portion CP1 in which the first transmission line and the second transmission line are branched in a T shape from the line portion SL. Other configurations are substantially the same as the configurations of the multilayer substrate 101.

As illustrated in FIG. 9, the first signal conductors 61 and 62, the second signal conductors 71 and 72, and the ground conductors 81, 82, 83, 84, 85, 86, 87, and 88 are exposed on the first primary surface VS1 of the stacked body 10B. The first signal conductor 61 and the ground conductors 81 and 82 are connection portions of the first transmission line in the first connection portion CP1, and the second signal conductor 71 and the ground conductors 83 and 84 are connection portions of the second transmission line in the first connection portion CP1. In addition, the first signal conductor 62 and the ground conductors 85 and 86 are connection portions of the first transmission line in the second connection portion CP2, and the second signal conductor 72 and the ground conductors 87 and 88 are connection portions of the second transmission line in the second connection portion CP2. In the fourth preferred embodiment, each of the first signal conductors 61 and 62 corresponds to a "first external connection electrode", and each of the second signal conductors 71 and 72 corresponds to a "second external connection electrode".

As described above, a multilayer substrate according to a preferred embodiment of the present invention may include a structure in which a plurality of transmission lines are branched. It is to be noted that, while the fourth preferred embodiment of the present invention describes an example of a multilayer substrate in which the transmission line is branched into the first transmission line and the second transmission line, the present invention is not limited to such a configuration. As described in full detail later, in a case of a multilayer substrate including three or more transmission lines, the transmission lines may be branched into one transmission line and the other transmission lines. For example, in a case of a multilayer substrate including a first transmission line, a second transmission line, and a third transmission line, the transmission lines may be branched into the first transmission line and the second transmission line, and the third transmission line.

Fifth Preferred Embodiment

A fifth preferred embodiment of the present invention describes a multilayer substrate including two or more transmission lines.

Figure 10:
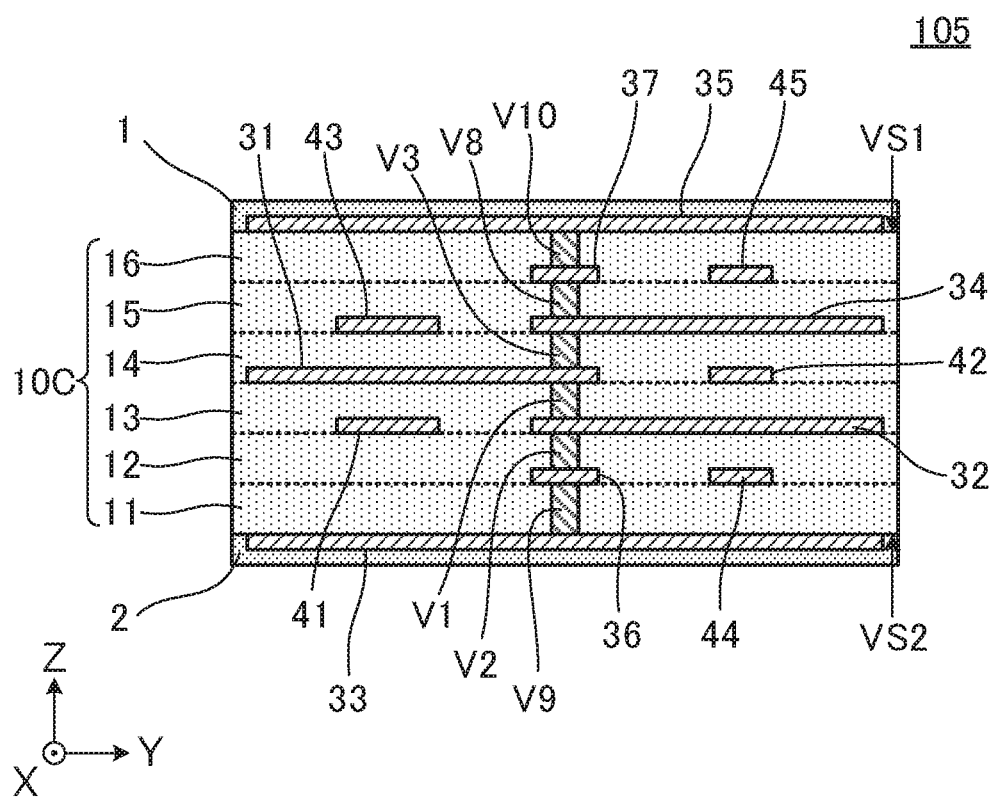
FIG. 10 is a cross-sectional view of a line portion of a multilayer substrate 105 according to a fifth preferred embodiment of the present invention.
Figure 11:
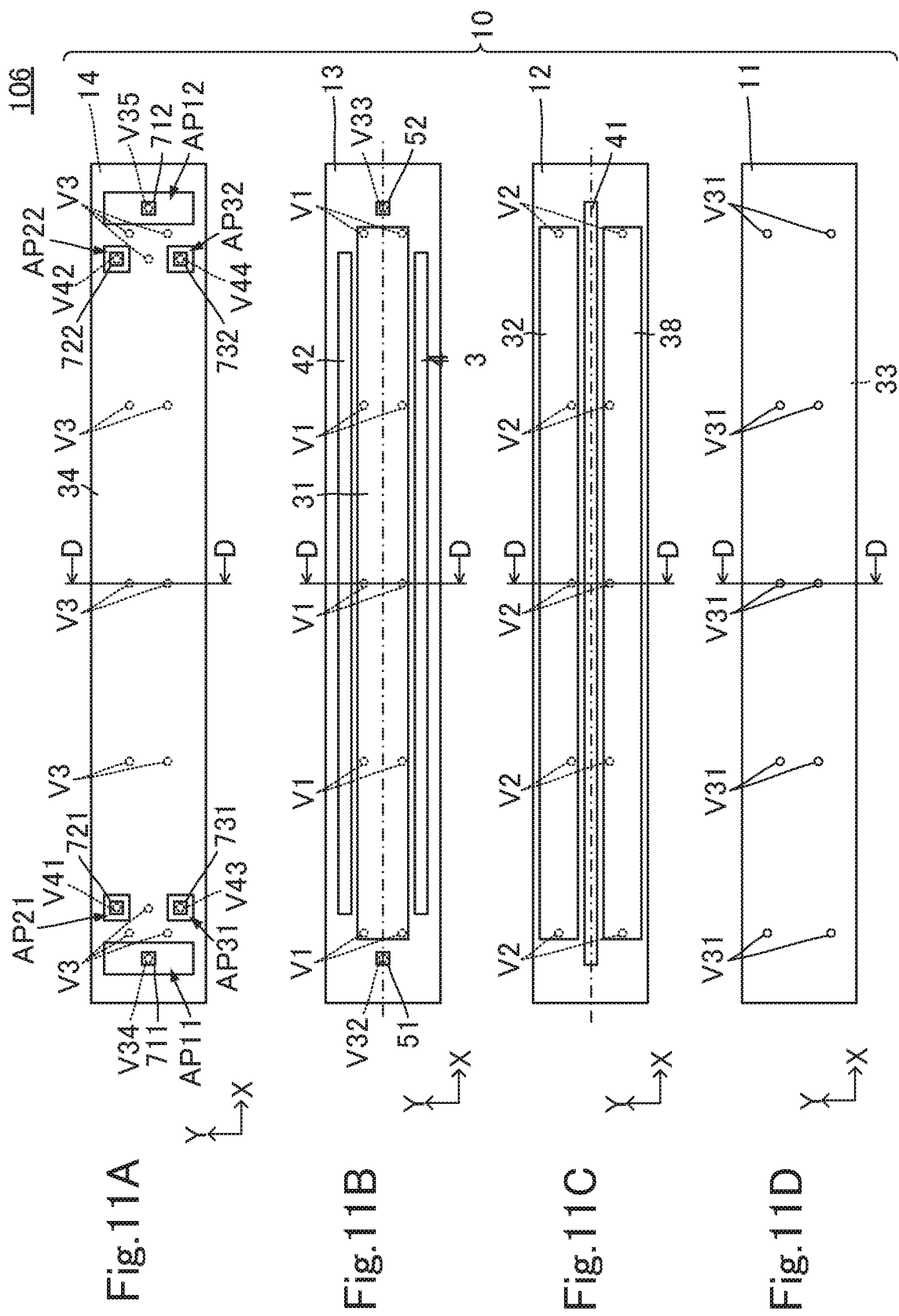
FIGS. 11A to 11D are exploded plan views of a multilayer substrate 106 according to a sixth preferred embodiment of the present invention.

FIG. 10 is a cross-sectional view of a line portion of a multilayer substrate 105 according to the fifth preferred embodiment of the present invention.

The multilayer substrate 105 includes a stacked body 10C obtained by stacking a plurality of insulating base materials 11, 12, 13, 14, 15, and 16, a conductor (such as a first signal line 41, a second signal line 42, a third signal line 43, a fourth signal line 44, a fifth signal line 45, a first ground conductor 31, a second ground conductor 32, a third ground conductor 33, a fourth ground conductor 34, a fifth ground conductor 35, a sixth ground conductor 36, a seventh ground conductor 37, a first interlayer connection conductor V1, a second interlayer connection conductor V2, a third interlayer connection conductor V3, an eighth interlayer connection conductor V8, a ninth interlayer connection conductor V9, and a tenth interlayer connection conductor V10) provided in any one of the plurality of insulating base materials 11, 12, 13, 14, 15, and 16, and protective layers 1 and 2.

As illustrated in FIG. 10, the stacked body 10C is obtained by stacking the insulating base materials 11, 12, 13, 14, 15, and 16 in this order. The protective layer 1 is provided on the first primary surface VS1 of the stacked body 10C, and the protective layer 2 is provided on the second primary surface VS2 of the stacked body 10C.

As illustrated in FIG. 10, the first signal line 41, the second signal line 42, the third signal line 43, the fourth signal line 44, and the fifth signal line 45 are disposed at different layers, respectively, and extend in parallel or substantially in parallel with each other when viewed in the Z-axis direction.

In addition, as illustrated in FIG. 10, the first ground conductor 31 is provided on the same layer as the layer on which the second signal line 42 is provided, and is overlapped with the first signal line 41 and the third signal line 43 when viewed in the Z-axis direction. The second ground conductor 32 is provided on the same layer as the layer on which the first signal line 41 is provided, and is overlapped with the second signal line 42 and the fourth signal line 44 when viewed in the Z-axis direction.

The third ground conductor 33, as illustrated in FIG. 10, is a conductor provided over substantially the entire surface of the second primary surface VS2 of the stacked body 10C. Therefore, the third ground conductor 33 is disposed to face the first ground conductor 31 across the first signal line 41 with respect to the Z-axis direction, and is disposed to face the second ground conductor 32 across the fourth signal line 44 with respect to the Z-axis direction.

The fourth ground conductor 34 is provided on a layer different from the layer on which the first ground conductor 31 is provided, and is disposed to face the second ground conductor 32 across the second signal line 42 with respect to the Z-axis direction.

The fifth ground conductor 35, as illustrated in FIG. 10, is a conductor provided over substantially the entire surface of the first primary surface VS1 of the stacked body 10C. Therefore, the fifth ground conductor 35 is disposed to face the first ground conductor 31 across the third signal line 43 with respect to the Z-axis direction, and is disposed to face the fourth ground conductor 34 across the fifth signal line 45 with respect to the Z-axis direction.

The first ground conductor 31, the second ground conductor 32, the third ground conductor 33, the fourth ground conductor 34, the fifth ground conductor 35, the sixth ground conductor 36, and the seventh ground conductor 37 are electrically connected with each other through the interlayer connection conductors (the first interlayer connection conductor V1, the second interlayer connection conductor V2, the third interlayer connection conductor V3, the eighth interlayer connection conductor V8, the ninth interlayer connection conductor V9, and the tenth interlayer connection conductor V10).

In the fifth preferred embodiment, the first signal line 41, the first ground conductor 31, the third ground conductor 33, the insulating base material 13 interposed between the first signal line 41 and the first ground conductor 31, and the insulating base materials 11 and 12 interposed between the first signal line 41 and the third ground conductor 33 define a first transmission line. In the fifth preferred embodiment, the second signal line 42, the second ground conductor 32, the fourth ground conductor 34, the insulating base material 13 interposed between the second signal line 42 and the second ground conductor 32, and the insulating base material 14 interposed between the second signal line 42 and the fourth ground conductor 34 define a second transmission line.

Further, in the fifth preferred embodiment, the third signal line 43, the first ground conductor 31, the fifth ground conductor 35, the insulating base material 14 interposed between the third signal line 43 and the first ground conductor 31, and the insulating base materials 15 and 16 interposed between the third signal line 43 and the fifth ground conductor 35 define a third transmission line. In the fifth preferred embodiment, the fourth signal line 44, the second ground conductor 32, the third ground conductor 33, the insulating base material 12 interposed between the fourth signal line 44 and the second ground conductor 32, and the insulating base material 11 interposed between the fourth signal line 44 and the third ground conductor 33 define a fourth transmission line. In the fifth preferred embodiment, the fifth signal line 45, the fourth ground conductor 34, the fifth ground conductor 35, the insulating base material 15 interposed between the fifth signal line 45 and the fourth ground conductor 34, and the insulating base material 16 interposed between the fifth signal line 45 and the fifth ground conductor 35 define a fifth transmission line.

In the fifth preferred embodiment, as illustrated in FIG. 10, the two insulating base materials 11 and 12 are interposed between the first signal line 41 and the third ground conductor 33. Accordingly, in comparison with a configuration in which one insulating base material is interposed between a signal line and a ground conductor, a gap between the first signal line 41 and the third ground conductor 33 becomes large, so that capacitance to be generated between the first signal line 41 and the third ground conductor 33 is able to be reduced. Therefore, with this configuration, since a line width (the width in the Y-axis direction) of the first signal line 41 is able to be made larger than a line width of other signal transmission lines (the second signal line 42, the fourth signal line 44, and the fifth signal line 45, for example), direct-current resistance of the first signal line 41 is able to be reduced.

Similarly, in the fifth preferred embodiment, as illustrated in FIG. 10, the two insulating base materials 15 and 16 are interposed between the third signal line 43 and the fifth ground conductor 35. Therefore, with this configuration, since a line width (the width in the Y-axis direction) of the third signal line 43 is able to be made larger than a line width of other signal transmission lines (the second signal line 42, the fourth signal line 44, and the fifth signal line 45, for example), direct-current resistance of the third signal line 43 is able to be reduced.

As illustrated in FIG. 10, in the fifth preferred embodiment, the protective layer 1 covers the entirety of the fifth ground conductor 35 provided over substantially the entire surface of the first primary surface VS1 (the insulating base material 16) of the stacked body 10C. Therefore, although the joining strength between the protective layer 1 and the stacked body 10C is reduced and causes the protective layer 1 to become easily separated from the stacked body 10C, even when the protective layer 1 is separated, a change in electrical characteristics of the multilayer substrate is small.

Similarly, in the fifth preferred embodiment, the protective layer 2 covers the entirety of the third ground conductor 33 provided over substantially the entire surface of the second primary surface VS2 (the insulating base material 11) of the stacked body 10C. Therefore, although the protective layer 2 becomes easily separated from the stacked body 10C, even when the protective layer 2 is separated, the change in electrical characteristics of the multilayer substrate is small.

In addition, while the fifth preferred embodiment of the present provides an example of a multilayer substrate including five transmission lines, the present invention is not limited to such a configuration. The number of transmission lines that are provided on the multilayer substrate is able to be appropriately changed as long as the number is two or more.

Sixth Preferred Embodiment

Figure 12:
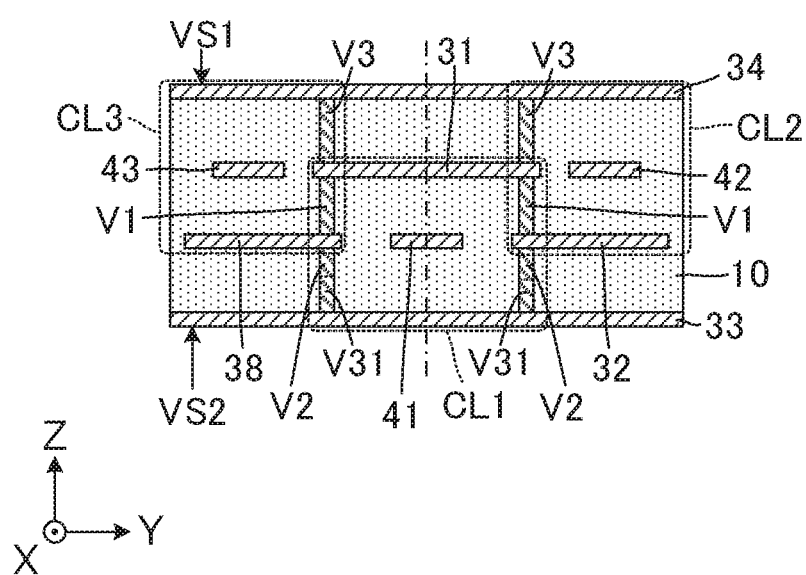
FIG. 12 is a cross-sectional view of the multilayer substrate 106 according to the sixth preferred embodiment of the present invention.
Figure 13:
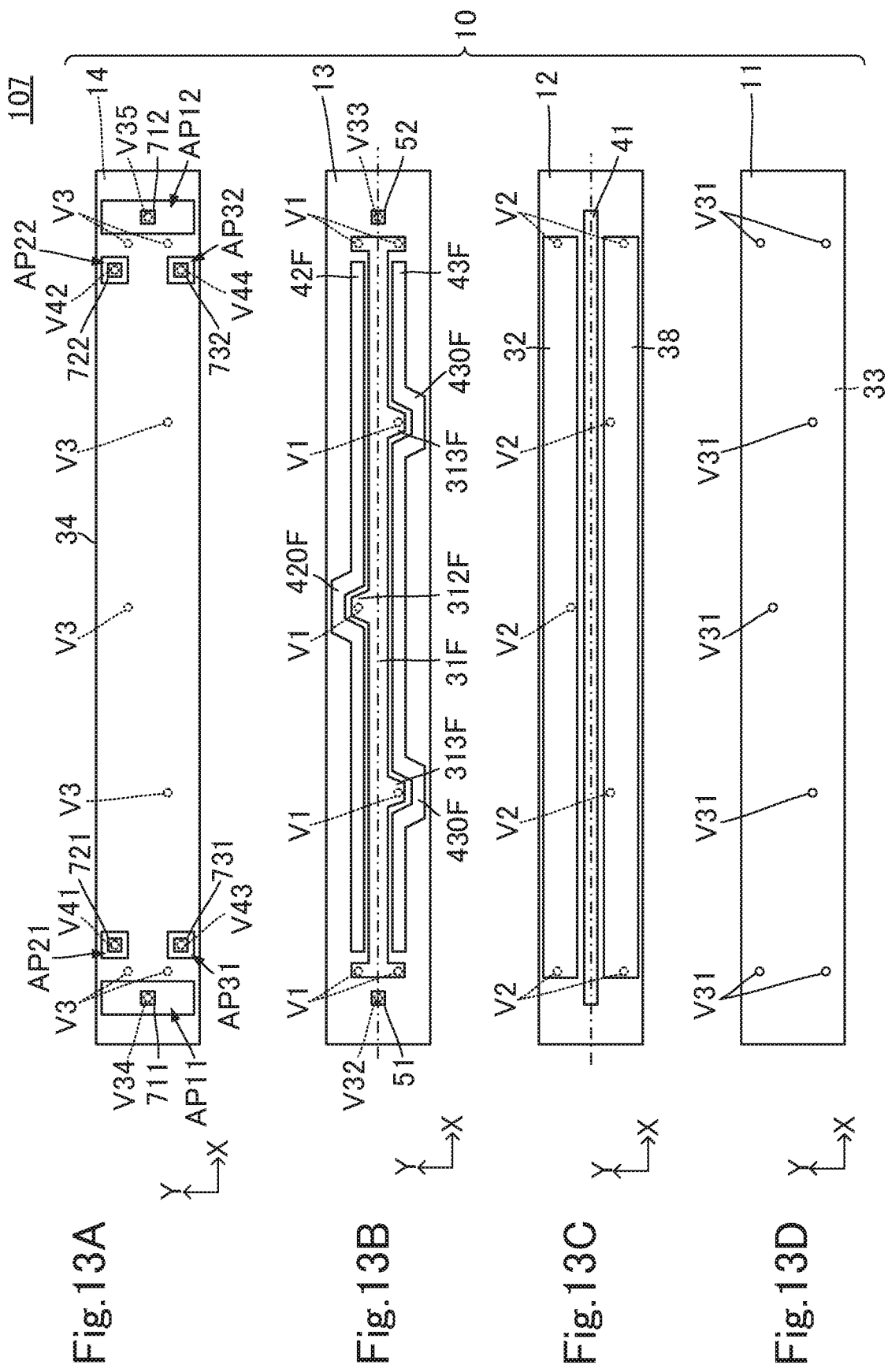
FIGS. 13A to 13D are exploded plan views of a multilayer substrate 107 according to a seventh preferred embodiment of the present invention.
Figure 14:
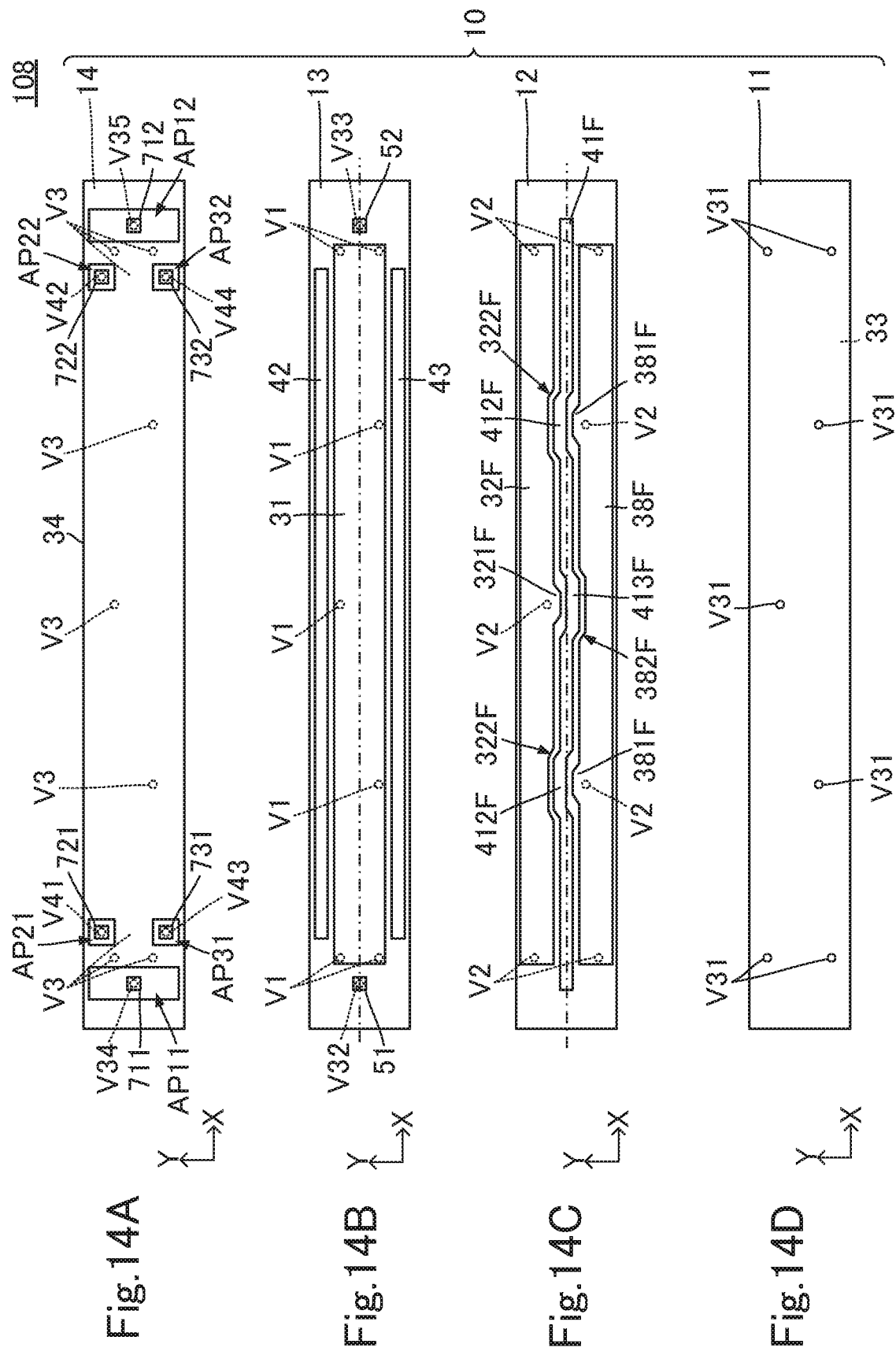
FIGS. 14A to 14D are exploded plan views of a multilayer substrate 108 according to an eighth preferred embodiment of the present invention.

A sixth preferred embodiment of the present invention describes a multilayer substrate including three transmission lines. FIGS. 11A to 11D are exploded plan views of a multilayer substrate 106 according to the sixth preferred embodiment of the present invention. FIG. 12 is a cross-sectional view of the multilayer substrate 106 according to the sixth preferred embodiment of the present invention. FIG. 12 illustrates a D-D cross-section illustrated in FIGS. 11A to 11D.

The multilayer substrate 106 according to the sixth preferred embodiment is different from the multilayer substrate 101 according to the first preferred embodiment in that the multilayer substrate 106 further includes a third transmission line CL3 in addition to the first transmission line CL1 and the second transmission line CL2. The basic configuration such as a material of each component of the multilayer substrate 106 is the same as or similar to the configuration of the multilayer substrate 101 according to the first preferred embodiment, and a description of the same or similar configuration will be omitted.

The multilayer substrate 106 includes a stacked body 10, a first ground conductor 31, a second ground conductor 32, a third ground conductor 33, a fourth ground conductor 34, an eighth ground conductor 38, a first signal line 41, a second signal line 42, and a third signal line 43. The multilayer substrate 106 includes first signal conductors 51 and 52 and external connection conductors 711, 712, 721, 722, 731, and 732. The stacked body 10 is obtained by stacking the insulating base materials 11, 12, 13, and 14 in this order.

The third ground conductor 33 is provided on a surface of the insulating base material 11 on a side opposite to the insulating base material 12. The third ground conductor 33 is provided on the entirety of the surface.

The first signal line 41, the second ground conductor 32, and the eighth ground conductor 38 are provided on the surface of the insulating base material 12 on the side of the insulating base material 13. Each of the first signal line 41, the second ground conductor 32, and the eighth ground conductor 38 has a rectangular or substantially rectangular shape of which the X-axis direction is a longitudinal direction. The width (the length in the Y-axis direction) of the second ground conductor 32 is the same or substantially the same as the width (the length in the Y-axis direction) of the eighth ground conductor 38. The width (the length in the Y-axis direction) of the first signal line 41 is smaller than the width of the second ground conductor 32 and the width of the eighth ground conductor 38.

The first signal line 41, the second ground conductor 32, and the eighth ground conductor 38 are disposed at intervals in the Y-axis direction and extend in parallel or substantially in parallel with each other in the X-axis direction. In the Y-axis direction, the first signal line 41 is disposed between the second ground conductor 32 and the eighth ground conductor 38. The second ground conductor 32 and the eighth ground conductor 38 are disposed at positions symmetric to each other with respect to a reference plane that extends through the center in the width direction of the first signal line 41 and is in parallel or substantially in parallel to the X-axis direction and the Z-axis direction. It is to be noted that, in the cross-sectional view illustrated in FIG. 12, the second ground conductor 32 and the eighth ground conductor 38 are disposed at positions that are in line symmetry with respect to a dashed-dotted line that extends in the Z-axis direction through the center in the width direction of the first signal line 41. This reference plane also means a reference plane that extends in the X-axis direction through the center in the width direction of the insulating base material 12.

The second signal line 42, the third signal line 43, the first ground conductor 31, and the first signal conductors 51 and 52 are provided on the surface of the insulating base material 13 on the side of the insulating base material 14.

The second signal line 42, the third signal line 43, the first ground conductor 31 each have a rectangular or substantially rectangular shape of which the X-axis direction is a longitudinal direction. The width (the length in the Y-axis direction) of the second signal line 42 is the same or substantially the same as the width (length in the Y-axis direction) of the third signal line 43. The width (the length in the Y-axis direction) of the first ground conductor 31 is larger than the width of the second signal line 42 and the width of the third signal line 43.

The second signal line 42, the third signal line 43, and the first ground conductor 31 are disposed at intervals in the Y-axis direction and extend in parallel or substantially in parallel with each other in the X-axis direction. In the Y-axis direction, the first ground conductor 31 is disposed between the second signal line 42 and the third signal line 43. The second signal line 42 and the third signal line 43 are disposed at positions symmetric to each other with respect to a reference plane that extends through the center in the width direction of the first ground conductor 31 and is in parallel or substantially in parallel to the X-axis direction and the Z-axis direction. It is to be noted that, in the cross-sectional view illustrated in FIG. 12, the second signal line 42 and the third signal line 43 are disposed at positions that are in line symmetry with respect to a dashed-dotted line that extends in the Z-axis direction through the center in the width direction of the first ground conductor 31.

As viewed in the stacking direction, the second signal line 42 is overlapped with the second ground conductor 32 over the entire length in the longitudinal direction (the X-axis direction). As viewed in the stacking direction, the third signal line 43 is overlapped with the eighth ground conductor 38 over the entire length in the longitudinal direction (the X-axis direction).

As viewed in the stacking direction, the first ground conductor 31 is overlapped with the first signal line 41 over the entire length in the longitudinal direction (the X-axis direction). Further, when viewed in the stacking direction, the first ground conductor 31 is overlapped with an end portion of the second ground conductor 32 on the side of the first signal line 41 and an end portion of the eighth ground conductor 38 on the side of the first signal line 41.

Each of the first signal conductors 51 and 52 has a rectangular or substantially rectangular shape. As viewed in the stacking direction, the first signal conductor 51 is overlapped with one end portion of the first signal line 41 in the longitudinal direction (the X-axis direction), and the first signal conductor 52 is overlapped with the other end portion of the first signal line 41 in the longitudinal direction (the X-axis direction).

The fourth ground conductor 34 and the external connection conductors 711, 712, 721, 722, 731, and 732 are provided on a surface of the insulating base material 14 on a side opposite to the insulating base material 13. The fourth ground conductor is provided over substantially the entire surface of the insulating base material 14 on the side opposite to the insulating base material 13.

The external connection conductors 711, 712, 721, 722, 731, and 732 each have a rectangular or substantially rectangular shape, and are spaced from the fourth ground conductor 34 through opening portions (conductor-free portions) AP11, AP12, AP21, AP22, AP31, and AP32.

The external connection conductors 711, 721, and 731 are provided in the vicinity of one end of the insulating base material 14 in the longitudinal direction (the X-axis direction). As viewed in the stacking direction, the external connection conductor 711 is overlapped with the first signal conductor 51, the external connection conductor 721 is overlapped with the second signal line 42, and the external connection conductor 731 is overlapped with the third signal line 43.

The external connection conductors 712, 722, and 732 are provided in the vicinity of the other end of the insulating base material 14 in the longitudinal direction (the X-axis direction). When viewed in the stacking direction, the external connection conductor 712 is overlapped with the first signal conductor 52, the external connection conductor 722 is overlapped with the second signal line 42, and the external connection conductor 732 is overlapped with the third signal line 43.

The insulating base material 11 includes a plurality of interlayer connection conductors V31. A portion of the insulating base material 12 that is overlapped with the second ground conductor 32 and the eighth ground conductor 38 includes a plurality of second interlayer connection conductors V2. As viewed in the stacking direction, the arrangement pattern of the plurality of interlayer connection conductors V31 is the same as the arrangement pattern of the plurality of second interlayer connection conductors V2, and an interlayer connection conductor V31 and a second interlayer connection conductor V2 at the same position are connected to each other. As a result, the second ground conductor 32 and the third ground conductor 33 are connected at a plurality of points, and the eighth ground conductor 38 and the third ground conductor 33 are connected at a plurality of points.

A portion of the insulating base material 13 that is overlapped with the first ground conductor 31 includes a plurality of first interlayer connection conductors V1. More specifically, when viewed in the stacking direction, the plurality of first interlayer connection conductors V1 are provided in the portion with which the first ground conductor 31, the second ground conductor 32, and the eighth ground conductor 38 are overlapped. As a result, the first ground conductor 31 and the second ground conductor 32 are connected at a plurality of points, and the first ground conductor 31 and the eighth ground conductor 38 are connected at a plurality of points.

Further, when viewed in the stacking direction, the arrangement pattern of the plurality of first interlayer connection conductors V1 is the same as the arrangement pattern of the plurality of interlayer connection conductors V31 and the plurality of second interlayer connection conductors V2.

A portion of the insulating base material 13 that is overlapped with the first signal conductor 51 includes an interlayer connection conductor V32. As a result, the first signal conductor 51 and the first signal line 41 are connected. A portion of the insulating base material 13 that is overlapped with the first signal conductor 52 includes an interlayer connection conductor V33. As a result, the first signal conductor 52 and the first signal line 41 are connected.

A portion of the insulating base material 14 that is overlapped with the fourth ground conductor 34 includes a plurality of third interlayer connection conductors V3. More specifically, when viewed in the stacking direction, the plurality of third interlayer connection conductors V3 are provided in the portion with which the fourth ground conductor 34 and the first ground conductor 31 are overlapped. As a result, the fourth ground conductor 34 and the first ground conductor 31 are connected at a plurality of points.

It is to be noted that, when viewed in the stacking direction, the plurality of third interlayer connection conductors V3 are disposed at positions that are overlapped with at least positions on which the plurality of first interlayer connection conductors V1 are disposed. Further, the plurality of third interlayer connection conductors V3, when viewed in the stacking direction, are disposed between the external connection conductors 721 and 731 and between the external connection conductors 722 and 732, respectively.

Portions of the insulating base material 14 that are overlapped with the external connection conductors 711, 712, 721, 722, 731, and 732 include interlayer connection conductors V34, V35, V41, V42, V43, and V44, respectively. As a result, the external connection conductor 711 is connected to the first signal conductor 51, and the external connection conductor 712 is connected to the first signal conductor 52. The external connection conductors 721 and 722 are connected to the second signal line 42, and the external connection conductors 731 and 732 are connected to the third signal line 43.

With use of such a configuration, the multilayer substrate 106 includes a first transmission line CL1, a second transmission line CL2, and a third transmission line CL3. The first transmission line CL1 is provided by disposing the first signal line 41 between the first ground conductor 31 and the third ground conductor 33. The second transmission line CL2 is provided by disposing the second signal line 42 between the second ground conductor 32 and the fourth ground conductor 34. The third transmission line CL3 is provided by disposing the third signal line 43 between the fourth ground conductor 34 and the eighth ground conductor 38.

As described above, since all of the first transmission line CL1, the second transmission line CL2, and the third transmission line CL3 that are provided in the multilayer substrate 106 are structured such that a ground conductor is disposed on the both sides of a signal conductor in the stacking direction, the unnecessary radiation to the outside by all the transmission lines is significantly reduced or prevented reliably.

In addition, the multilayer substrate 106, when viewed in the stacking direction, includes a third ground conductor 33 that is overlapped with all of the first signal line 41, the second signal line 42, and the third signal lines 43 on the second primary surface VS2 of the stacked body 10, and includes the fourth ground conductor 34 of the first primary surface VS1 of the stacked body 10. As a result, the unnecessary radiation to the outside is significantly reduced or prevented further reliably to all of the first transmission line CL1, the second transmission line CL2, and the third transmission line CL3.

In addition, in the multilayer substrate 106, the first signal line 41 is disposed between the second ground conductor 32 and the eighth ground conductor 38 in the Y-axis direction, so that unnecessary radiation in the Y-axis direction is also significantly reduced or prevented. Further, in the Y-axis direction of the first signal line 41, a plurality of interlayer connection conductors (the first interlayer connection conductor V1, the second interlayer connection conductor V2, the interlayer connection conductor V31) arranged in the X-axis direction are disposed and are connected to the first ground conductor 31, the second ground conductor 32, the third ground conductor 33, and the eighth ground conductor 38, so that the unnecessary radiation in the Y-axis direction is further significantly reduced or prevented.

In addition, the first ground conductor 31 having a greater length in the Y-axis direction than the length of the second signal line 42 and the third signal line 43 is disposed between the second signal line 42 and the third signal line 43 in the Y-axis direction, so that higher isolation between the second signal line 42 and the third signal line 43 is able to be ensured.

In addition, in the multilayer substrate 106, the second signal line 42 and the third signal line 43 are symmetric to each other with respect to a reference plane that extends through the center in the Y-axis direction (the width direction) of the multilayer substrate 106 and is in parallel or substantially in parallel to the X-axis direction and the Z-axis direction. Further, the ground conductors configuring each transmission line are also arranged symmetric to each other with respect to the reference plane. Therefore, the second transmission line CL2 and the third transmission line CL3 are also symmetric with respect to the reference plane. As a result, structural and electromagnetic balance in the width direction (the Y-axis direction) in the multilayer substrate 106 is improved. In addition, with such a configuration, the occurrence of uneven irregularities on the surface (the first primary surface VS1 or the second primary surface VS2) of the multilayer substrate 106 is able to be significantly reduced or prevented, so that the bending workability of the multilayer substrate and the mounting performance of the multilayer substrate to be mounted on a circuit board or the like are improved.

Seventh Preferred Embodiment

FIGS. 13A to 13D are exploded plan views of a multilayer substrate 107 according to a seventh preferred embodiment of the present invention. The multilayer substrate 107 according to the seventh preferred embodiment is different from the multilayer substrate 106 according to the sixth preferred embodiment in the configuration of a first ground conductor 31F, a second signal line 42F, and a third signal line 43F. Other configurations of the multilayer substrate 107 are the same as or similar to the configurations of the multilayer substrate 106, and a description of the same or similar configuration will be omitted.

The first ground conductor 31F includes protruding portions 312F and 313F. The protruding portions 312F and 313F partially protrude in the Y-axis direction at predetermined positions in the X-axis direction of the first ground conductor 31F.

The width (the length in the Y-axis direction) of the first ground conductor 31F is smaller than the width of the first ground conductor 31 of the multilayer substrate 106 described in the sixth preferred embodiment (see FIGS. 11A to 11D).

The protruding portion 312F protrudes to the side of the second signal line 42F in the first ground conductor 31F. The protruding portion 313F protrudes to the side of the third signal line 43F in the first ground conductor 31F.

The second signal line 42F includes a bent portion 420F. The second signal line 42F, as compared with the second signal line 42 of the multilayer substrate 106 illustrated in FIGS. 11A to 11D, is disposed closer to the first ground conductor 31F in the Y-axis direction, that is, to the center position in the insulating base material 13 in the Y-axis direction. Most of the second signal line 42F in the longitudinal direction except the bent portion 420F is overlapped with the protruding portion 312F of the first ground conductor 31F in the Y-axis direction. The bent portion 420F is disposed along the outer periphery of the protruding portion 312F. In other words, the bent portion 420F, when viewed in the Z-axis direction, is provided in a shape that bypasses the protruding portion 312F.

The third signal line 43F includes a plurality of bent portions 430F. The third signal line 43F, as compared with the third signal line 43 of the multilayer substrate 106 illustrated in FIGS. 11A to 11D, is disposed closer to the first ground conductor 31F in the Y-axis direction, that is, to the center position in the insulating base material 13 in the Y-axis direction. Most of the third signal line 43F in the longitudinal direction except the bent portion 430F is overlapped with the protruding portion 313F of the first ground conductor 31F in the Y-axis direction. The bent portion 430F is disposed along the outer periphery of the protruding portion 313F. In other words, the bent portion 430F, when viewed in the Z-axis direction, is provided in a shape that bypasses the protruding portion 313F.

With such a configuration, the width (the length in the Y-axis direction) of the stacked body 10, that is, the multilayer substrate 107, is able to be reduced.

Eighth Preferred Embodiment

FIGS. 14A to 14D are exploded plan views of a multilayer substrate 108 according to an eighth preferred embodiment of the present invention. The multilayer substrate 108 according to the eighth preferred embodiment is different from the multilayer substrate 106 according to the sixth preferred embodiment in the configuration of a first signal line 41F, a second ground conductor 32F, and an eighth ground conductor 38F. Other configurations of the multilayer substrate 108 are the same as or similar to the configurations of the multilayer substrate 106, and a description of the same or similar configuration will be omitted.

The second ground conductor 32F includes a protruding portion 321F. The protruding portion 321F partially protrudes in the Y-axis direction at a predetermined position in the X-axis direction of the second ground conductor 32F. The protruding portion 321F protrudes to the side of the first signal line 41F.

The eighth ground conductor 38F includes a plurality of protruding portions 381F. The plurality of protruding portions 381F partially protrude in the Y-axis direction at predetermined positions in the X-axis direction of the eighth ground conductor 38F. The plurality of protruding portions 381F protrude to the side of the first signal line 41F.

The first signal line 41F includes bent portions 412F and 413F. The bent portion 412F is disposed along the outer periphery of the protruding portions 381F of the eighth ground conductor 38F. In other words, the bent portion 412F, when viewed in the Z-axis direction, is provided in a shape that bypasses the protruding portion 381F. The bent portion 413F is disposed along the outer periphery of the protruding portions 321F of the second ground conductor 32F. In other words, the bent portion 413F, when viewed in the Z-axis direction, is provided in a shape that bypasses the protruding portion 321F.

With such a configuration, in a similar manner to the multilayer substrate 107 according to the seventh preferred embodiment, the width (the length in the Y-axis direction) of the multilayer substrate 108, that is, the stacked body 10, is able to be reduced.

Ninth Preferred Embodiment

Figure 15:
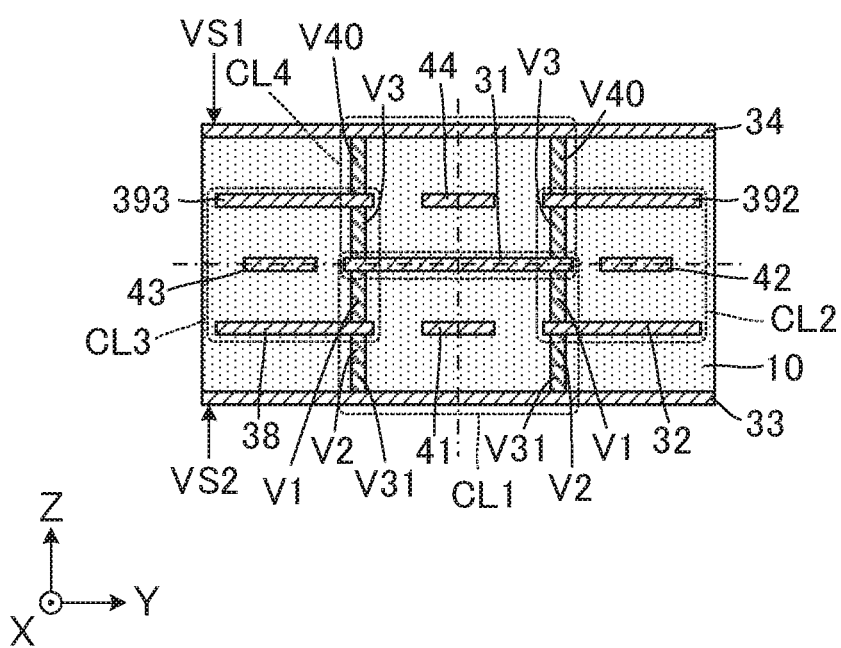
FIG. 15 is a cross-sectional view of a multilayer substrate 109 according to a ninth preferred embodiment of the present invention.

FIG. 15 is a cross-sectional view of a multilayer substrate 109 according to a ninth preferred embodiment of the present invention. The multilayer substrate 109 according to the ninth preferred embodiment is different from the multilayer substrate 106 according to the sixth preferred embodiment in that the multilayer substrate 109 further includes a fourth transmission line CL4. Other configurations of the multilayer substrate 109 are the same as or similar to the configurations of the multilayer substrate 106, and a description of the same or similar configuration will be omitted.

The multilayer substrate 109, in addition to the configuration of the multilayer substrate 106, includes a fourth signal line 44, ninth ground conductors 392 and 393, and a plurality of interlayer connection conductors V40. The fourth signal line 44, the ninth ground conductors 392 and 393, and the plurality of interlayer connection conductors V40 are provided in the stacked body 10.

The fourth signal line 44 is provided between the first ground conductor 31 and the fourth ground conductor 34 in the Z-axis direction. The position of the fourth signal line 44 in the Y-axis direction is the same as the position of the first signal line 41. The shape of the fourth signal line 44 is the same or substantially the same as the shape of the first signal line 41 except the end portions in the longitudinal direction.

The ninth ground conductor 392 is provided between the second signal line 42 and the fourth ground conductor 34 in the Z-axis direction. The position of the ninth ground conductor 392 in the Z-axis direction is the same or substantially the same as the position of the fourth signal line 44. The position of the ninth ground conductor 392 in the Y-axis direction is the same or substantially the same as the position of the second ground conductor 32. The shape of the ninth ground conductor 392 is the same or substantially the same as the shape of the second ground conductor 32.

The ninth ground conductor 393 is provided between the third signal line 43 and the fourth ground conductor 34 in the Z-axis direction. The position of the ninth ground conductor 393 in the Z-axis direction is the same or substantially the same as the position of the fourth signal line 44. The position of the ninth ground conductor 393 in the Y-axis direction is the same or substantially the same as the position of the eighth ground conductor 38. The shape of the ninth ground conductor 393 is the same or substantially the same as the shape of the eighth ground conductor 38.

The plurality of interlayer connection conductors V40 are overlapped with the plurality of third interlayer connection conductors V3 when the stacked body 10 is viewed in the Y-axis direction. The plurality of interlayer connection conductors V40 electrically connect the ninth ground conductors 392 and 393 and the fourth ground conductor 34 to each other. In addition, the plurality of third interlayer connection conductors V3 electrically connect the ninth ground conductors 392 and 393 and the first ground conductor 31 to each other.

With the configuration of the multilayer substrate 109 according to the ninth preferred embodiment, the multilayer substrate 109 includes a first transmission line CL1, a second transmission line CL2, a third transmission line CL3, and a fourth transmission line CL4. The first transmission line CL1 is provided by disposing the first signal line 41 between the first ground conductor 31 and the third ground conductor 33. The second transmission line CL2 is provided by disposing the second signal line 42 between the second ground conductor 32 and the ninth ground conductor 392. The third transmission line CL3 is provided by disposing the third signal line 43 between the eighth ground conductor 38 and the ninth ground conductor 393. The fourth transmission line CL4 is provided by disposing the fourth signal line 44 between the first ground conductor 31 and the fourth ground conductor 34.

With the configuration of the multilayer substrate 109 according to the ninth preferred embodiment, the following operational effect is able to be further obtained in addition to the operational effect obtained by the multilayer substrate 106.

In the multilayer substrate 109, the first signal line 41 and the fourth signal line 44 are symmetric to each other with respect to a reference plane that extends through the center in the Z-axis direction (the stacking direction) of the multilayer substrate 109 and is in parallel or substantially in parallel to the X-axis direction and the Z-axis direction. It is to be noted that, in the cross-sectional view illustrated in FIG. 15, the first signal line 41 and the fourth signal line 44 are in line symmetry with respect to a dashed-dotted line that extends in the Y-axis direction through the center in the Z-axis direction (the stacking direction) of the multilayer substrate 109. Further, the ground conductors of each transmission line are also disposed symmetric to each other with respect to the reference plane. Therefore, the first transmission line CL1 and the fourth transmission line CL4 are also symmetric with respect to the reference plane. As a result, structural (physical) balance in the stacking direction in the multilayer substrate 109 is improved and electromagnetic balance is also improved.

It is to be noted that the structural (physical) balance in the stacking direction is able to be improved, so that the occurrence of the uneven irregularities of the multilayer substrate is significantly reduced or prevented and the mounting performance of the multilayer substrate to be mounted on a circuit board or the like is improved. In addition, a warp in the stacking direction of the multilayer substrate 109 is significantly reduced or prevented from occurring.

Tenth Preferred Embodiment

Figure 16:
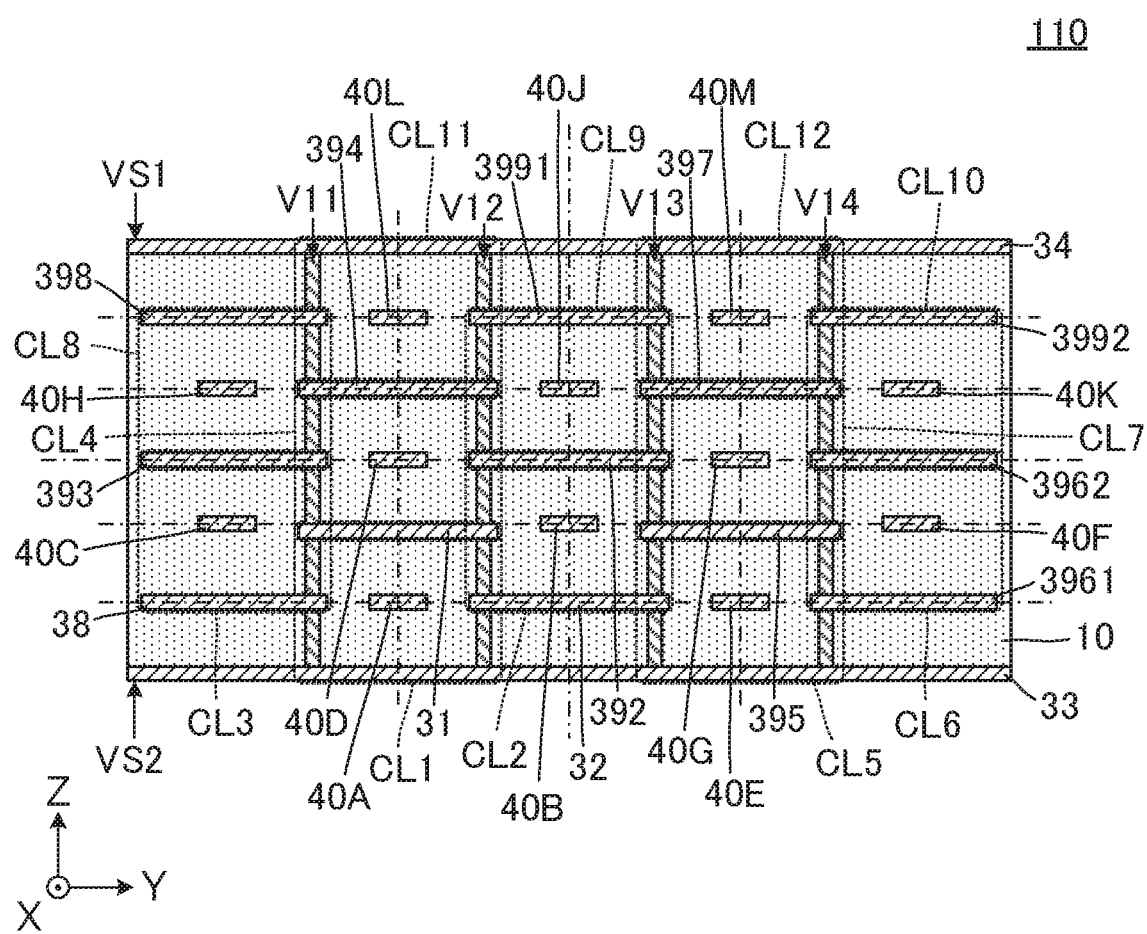
FIG. 16 is a cross-sectional view of a multilayer substrate 110 according to a tenth preferred embodiment of the present invention.

FIG. 16 is a cross-sectional view of a multilayer substrate 110 according to a tenth preferred embodiment of the present invention. The multilayer substrate 110 according to the tenth preferred embodiment is different from the multilayer substrate 109 according to the ninth preferred embodiment in that the multilayer substrate 110 further includes a plurality of transmission lines CL5 to CL12. Other basic configurations of the multilayer substrate 110 are the same as or similar to the basic configurations of the multilayer substrate 109, and a description of the same or similar configuration will be omitted.

As illustrated in FIG. 16, the multilayer substrate 110 includes 12 signal lines 40A, 40B, 40C, 40D, 40E, 40F, 40G, 40H, 40J, 40K, 40L, and 40M, a first ground conductor 31, a second ground conductor 32, a third ground conductor 33, a fourth ground conductor 34, an eighth ground conductor 38, and ninth ground conductors 392, 393, 394, 395, 3961, 3962, 397, 398, 3991, and 3992.

The signal lines 40A and 40E, the second ground conductor 32, the eighth ground conductor 38, and the ninth ground conductor 3961 are arranged side by side in the Y-axis direction. This layer is referred to as a first lateral conductor line layer. In such a case, the eighth ground conductor 38, the signal line 40A, the second ground conductor 32, the signal line 40E, and the ninth ground conductor 3961 are disposed in this order from a first end toward a second end of the Y-axis direction.

The signal lines 40C, 40B, and 40E, the first ground conductor 31, and the ninth ground conductor 395 are arranged side by side in the Y-axis direction. This layer is referred to as a second lateral conductor line layer. In such a case, the signal line 40C, the first ground conductor 31, the signal line 40B, the ninth ground conductor 395, and the signal line 40F are disposed in this order from the first end toward the second end of the Y-axis direction.

The signal lines 40D and 40G, and the ninth ground conductors 392, 393, and 3962 are arranged side by side in the Y-axis direction. This layer is referred to as a third lateral conductor line layer. In such a case, the ninth ground conductor 393, the signal line 40D, the ninth ground conductor 392, the signal line 40G, and the ninth ground conductor 3962 are disposed in this order from the first end toward the second end in the Y-axis direction.

The signal lines 40H, 40J, and 40K, and the ninth ground conductors 394 and 397 are arranged side by side in the Y-axis direction. This layer is referred to as a fourth lateral conductor line layer. In such a case, the signal line 40H, the ninth ground conductor 394, the signal line 40J, the ninth ground conductor 397, and the signal line 40K are disposed in this order from the first end toward the second end of the Y-axis direction.

The signal lines 40L and 40M, and the ninth ground conductors 398, 3991, and 3992 are arranged side by side in the Y-axis direction. This layer is referred to as a fifth lateral conductor line layer. In such a case, the ninth ground conductor 398, the signal line 40L, the ninth ground conductor 3991, the signal line 40M, and the ninth ground conductor 3992 are disposed in this order from the first end toward the second end in the Y-axis direction.

The first lateral conductor line layer, the second lateral conductor line layer, the third lateral conductor line layer, the fourth lateral conductor line layer, and the fifth lateral conductor line layer are arranged in this order from the second primary surface VS2 to the first primary surface VS1 of the stacked body 10.

The signal line 40C and the signal line 40H are disposed at positions that are overlapped with each other when viewed in the Z-axis direction. The signal line 40A, the signal line 40D, and the signal line 40L are disposed at positions that are overlapped with each other when viewed in the Z-axis direction. The signal line 40B and the signal line 40J are disposed at positions that are overlapped with each other when viewed in the Z-axis direction. The signal line 40E, the signal line 40G, and the signal line 40M are disposed at positions that are overlapped with each other, when viewed in the Z-axis direction. The signal line 40F and the signal line 40K are disposed at positions that are overlapped with each other when viewed in the Z-axis direction.

The first ground conductor 31 is disposed between the signal line 40A and the signal line 40D in the Z-axis direction of the stacked body 10, and is overlapped with the signal line 40A and the signal line 40D when viewed in the Z-axis direction.

The second ground conductor 32 is disposed between the signal line 40B and the third ground conductor 33 in the Z-axis direction of the stacked body 10, and is overlapped with the signal line 40B and the third ground conductor 33 when viewed in the Z-axis direction.

The eighth ground conductor 38 is disposed between the signal line 40C and the third ground conductor 33 in the Z-axis direction of the stacked body 10, and is overlapped with the signal line 40C and the third ground conductor 33 when viewed in the Z axis direction.

The ninth ground conductor 392 is disposed between the signal line 40B and the signal line 40J in the Z-axis direction of the stacked body 10, and is overlapped with the signal line 40B and the signal line 40J when viewed in the Z-axis direction.

The ninth ground conductor 393 is disposed between the signal line 40C and the signal line 40H in the Z-axis direction of the stacked body 10, and is overlapped with the signal line 40C and the signal line 40H when viewed in the Z-axis direction.

The ninth ground conductor 394 is disposed between the signal line 40D and the signal line 40L in the Z-axis direction of the stacked body 10, and is overlapped with the signal line 40D and the signal line 40L when viewed in the Z-axis direction.

The ninth ground conductor 395 is disposed between the signal line 40E and the signal line 40G in the Z-axis direction of the stacked body 10, and is overlapped with the signal line 40E and the signal line 40G when viewed in the Z-axis direction.

The ninth ground conductor 3961 is disposed between the signal line 40F and the third ground conductor 33 in the Z-axis direction of the stacked body 10, and is overlapped with the signal line 40F and the third ground conductor 33 when viewed in the Z-axis direction.

The ninth ground conductor 3962 is disposed between the signal line 40F and the signal line 40K in the Z-axis direction of the stacked body 10, and is overlapped with the signal line 40F and the signal line 40K when viewed in the Z-axis direction.

The ninth ground conductor 397 is disposed between the signal line 40G and the signal line 40M in the Z-axis direction of the stacked body 10, and is overlapped with the signal line 40G and the signal line 40M when viewed in the Z-axis direction.

The ninth ground conductor 398 is disposed between the signal line 40H and the fourth ground conductor 34 in the Z-axis direction of the stacked body 10, and is overlapped with the signal line 40H and the fourth ground conductor 34 when viewed in the Z-axis direction.

The ninth ground conductor 3991 is disposed between the signal line 40J and the fourth ground conductor 34 in the Z-axis direction of the stacked body 10, and is overlapped with the signal line 40J and the fourth ground conductor 34 when viewed in the Z-axis direction.

The ninth ground conductor 3992 is disposed between the signal line 40K and the fourth ground conductor 34 in the Z-axis direction of the stacked body 10, and is overlapped with the signal line 40K and the fourth ground conductor 34 when viewed in the Z-axis direction.

In other words, the 12 signal lines 40A, 40B, 40C, 40D, 40E, 40F, 40G, 40H, 40J, 40K, 40L, and 40M, the first ground conductor 31, the second ground conductor 32, the eighth ground conductor 38, the ninth ground conductors 392, 393, 394, 395, 3961, 3962, 397, 398, 3991, and 3992 are disposed alternately with each other in two dimensions of the Y-axis direction and the Z-axis direction in the stacked body 10. Then, all of the 12 signal lines 40A to 40M, the first ground conductor 31, the second ground conductor 32, the eighth ground conductor 38, the ninth ground conductors 392, 393, 394, 395, 3961, 3962, 397, 398, 3991, and 3992 are overlapped with the third ground conductor 33 and the fourth ground conductor 34 when the stacked body 10 is viewed in the Z-axis direction.

The interlayer connection conductor V11 is disposed between the positions of the signal lines 40C and 40H and the positions of the signal lines 40A, 40D, and 40L in the Y-axis direction. One end in the direction in which the interlayer connection conductor V11 extends is connected to the third ground conductor 33, and the other end is connected to the fourth ground conductor 34. The interlayer connection conductor V11 is connected to the eighth ground conductor 38, the first ground conductor 31, the ninth ground conductor 393, the ninth ground conductor 394, and the ninth ground conductor 398.

The interlayer connection conductor V12 is disposed between the positions of the signal lines 40A, 40D, and 40L and the positions of the signal lines 40B and 40J in the Y-axis direction. One end in the direction in which the interlayer connection conductor V12 extends is connected to the third ground conductor 33, and the other end is connected to the fourth ground conductor 34. The interlayer connection conductor V12 is connected to the second ground conductor 32, the first ground conductor 31, the ninth ground conductor 392, the ninth ground conductor 394, and the ninth ground conductor 3991.

The interlayer connection conductor V13 is disposed between the positions of the signal lines 40B and 40J and the positions of the signal lines 40E, 40G, and 40M in the Y-axis direction. One end in the direction in which the interlayer connection conductor V13 extends is connected to the third ground conductor 33, and the other end is connected to the fourth ground conductor 34. The interlayer connection conductor V13 is connected to the second ground conductor 32, the ninth ground conductor 395, the ninth ground conductor 392, the ninth ground conductor 397, and the ninth ground conductor 3991.

The interlayer connection conductor V14 is disposed between the positions of the signal lines 40E, 40G, and 40M and the positions of the signal lines 40F and 40K in the Y-axis direction. One end in the direction in which the interlayer connection conductor V14 extends is connected to the third ground conductor 33, and the other end is connected to the fourth ground conductor 34. The interlayer connection conductor V14 is connected to the ninth ground conductor 3961, the ninth ground conductor 395, the ninth ground conductor 3962, the ninth ground conductor 397, and the ninth ground conductor 3992.

With such a configuration, the multilayer substrate 110 includes a first transmission line CL1, a second transmission line CL2, a third transmission line CL3, a fourth transmission line CL4, a fifth transmission line CL5, a sixth transmission line CL6, a seventh transmission line CL7, an eighth transmission line CL8, a ninth transmission line CL9, a tenth transmission line CL10, an eleventh transmission line CL11, and a twelfth transmission line CL12.

The first transmission line CL1 is provided by disposing the signal line 40A between the first ground conductor 31 and the third ground conductor 33. The second transmission line CL2 is provided by disposing the signal line 40B between the second ground conductor 32 and the ninth ground conductor 392. The third transmission line CL3 is provided by disposing the signal line 40C between the eighth ground conductor 38 and the ninth ground conductor 393. The fourth transmission line CL4 is provided by disposing the signal line 40D between the first ground conductor 31 and the ninth ground conductor 394. The fifth transmission line CL5 is provided by disposing the signal line 40E between the ninth ground conductor 395 and the third ground conductor 33. The sixth transmission line CL6 is provided by disposing the signal line 40F between the ninth ground conductor 3961 and the ninth ground conductor 3962. The seventh transmission line CL7 is provided by disposing the signal line 40G between the ninth ground conductor 395 and the ninth ground conductor 397. The eighth transmission line CL8 is provided by disposing the signal line 40H between the ninth ground conductor 393 and the ninth ground conductor 398. The ninth transmission line CL9 is provided by disposing the signal line 40J between the ninth ground conductor 392 and the ninth ground conductor 3991. The tenth transmission line CL10 is provided by disposing the signal line 40K between the ninth ground conductor 3962 and the ninth ground conductor 3992. The eleventh transmission line CL11 is provided by disposing the signal line 40L between the ninth ground conductor 394 and the fourth ground conductor 34. The twelfth transmission line CL12 is provided by disposing the signal line 40M between the ninth ground conductor 397 and the fourth ground conductor 34.

With the configuration of the multilayer substrate 110 according to the tenth preferred embodiment, all of the 12 transmission lines are disposed symmetrically (in line symmetry with respect to any one of dashed-dotted lines illustrated in FIG. 16) with respect to any of the reference planes illustrated in FIG. 16. Further, the 12 transmission lines, in other words, the arrangement patterns of the entire transmission lines provided in the multilayer substrate 110 are symmetric with respect to a reference plane (a dashed-dotted line that extends in the Z-axis direction through the center in the Y-axis direction of the signal lines 40B and 40J in FIG. 16) that extends through the center of the Y-axis direction of the signal lines 40B and 40J and is in parallel or substantially in parallel to the X-axis direction and the Z-axis direction, and also with respect to a reference plane (a dashed-dotted line that extends in the Y-axis direction through the center in the Z-axis direction of the signal lines 40D and 40G in FIG. 16) that extends through the center of the Z-axis direction of the signal lines 40D and 40G and is in parallel or substantially in parallel to the X-axis direction and the Y-axis direction.

Specifically, the following symmetric patterns are obtained in the Y-axis direction. The first transmission line CL1 and the fifth transmission line CL5 extend through the center of the Y-axis direction of the signal lines 40B and 40J, and are symmetric with respect to a reference plane in parallel or substantially in parallel to the X-axis direction and the Z-axis direction. In the cross-sectional view illustrated in FIG. 16, the first transmission line CL1 and the fifth transmission line CL5 are in line symmetry with respect to a dashed-dotted line that extends in the Z-axis direction through the center in the Y-axis direction of the signal lines 40B and 40J. The fourth transmission line CL4 and the seventh transmission line CL7 extend through the center of the Y-axis direction of the signal lines 40B and 40J, and are symmetric with respect to a reference plane that extends in the X-axis direction and the Z-axis direction. In the cross-sectional view illustrated in FIG. 16, the fourth transmission line CL4 and the seventh transmission line CL7 are in line symmetry with respect to a dashed-dotted line that extends in the Z-axis direction through the center in the Y-axis direction of the signal lines 40B and 40J. The eleventh transmission line CL11 and the twelfth transmission line CL12 are symmetric with respect to a reference plane that extends through the center of the Y-axis direction of the signal lines 40B and 40J and is in parallel or substantially in parallel to the X-axis direction and the Z-axis direction. In the cross-sectional view illustrated in FIG. 16, the eleventh transmission line CL11 and the twelfth transmission line CL12 are in line symmetry with respect to a dashed-dotted line that extends in the Z-axis direction through the center in the Y-axis direction of the signal lines 40B and 40J.

The third transmission line CL3 and the second transmission line CL2 are symmetric with respect to a reference plane that extends through the center of the Y-axis direction of the signal lines 40A, 40D, and 40L and is in parallel or substantially in parallel to the X-axis direction and the Z-axis direction. In the cross-sectional view illustrated in FIG. 16, the third transmission line CL3 and the second transmission line CL2 are in line symmetry with respect to a dashed-dotted line that extends in the Z-axis direction through the center in the Y-axis direction of the signal lines 40A, 40D, and 40L. The second transmission line CL2 and the sixth transmission line CL6 are symmetric with respect to a reference plane that extends through the center of the Y-axis direction of the signal lines 40E, 40G, and 40M and is in parallel or substantially in parallel to the X-axis direction and the Z-axis direction. In the cross-sectional view illustrated in FIG. 16, the second transmission line CL2 and the sixth transmission line CL6 are in line symmetry with respect to a dashed-dotted line that extends in the Z-axis direction through the center in the Y-axis direction of the signal lines 40E, 40G, and 40L. The third transmission line CL3 and the sixth transmission line CL6 are symmetric with respect to a reference plane that extends through the center of the Y-axis direction of the signal lines 40B and 40J and is in parallel or substantially in parallel to the X-axis direction and the Z-axis direction. In the cross-sectional view illustrated in FIG. 16, the third transmission line CL3 and the sixth transmission line CL6 are in line symmetry with respect to a dashed-dotted line that extends in the Z-axis direction through the center in the Y-axis direction of the signal lines 40B and 40J.

The eighth transmission line CL8 and the ninth transmission line CL9 are symmetric with respect to a reference plane that extends through the center of the Y-axis direction of the signal lines 40A, 40D, and 40L and is in parallel or substantially in parallel to the X-axis direction and the Z-axis direction. In the cross-sectional view illustrated in FIG. 16, the eighth transmission line CL8 and the ninth transmission line CL9 are in line symmetry with respect to a dashed-dotted line that extends in the Z-axis direction through the center in the Y-axis direction of the signal lines 40A, 40D, and 40L. The ninth transmission line CL9 and the tenth transmission line CL10 are symmetric with respect to a reference plane that extends through the center of the Y-axis direction of the signal lines 40E, 40G, and 40M and is in parallel or substantially in parallel to the X-axis direction and the Z-axis direction. In the cross-sectional view illustrated in FIG. 16, the ninth transmission line CL9 and the tenth transmission line CL10 are in line symmetry with respect to a dashed-dotted line that extends in the Z-axis direction through the center in the Y-axis direction of the signal lines 40E, 40G, and 40M. The eighth transmission line CL8 and the tenth transmission line CL10 are symmetric with respect to a reference plane that extends through the center of the Y-axis direction of the signal lines 40B and 40J and is in parallel or substantially in parallel to the X-axis direction and the Z-axis direction. In the cross-sectional view illustrated in FIG. 16, the eighth transmission line CL8 and the tenth transmission line CL10 are in line symmetry with respect to a dashed-dotted line that extends in the Z-axis direction through the center in the Y-axis direction of the signal lines 40B and 40J.

In addition, the following symmetric patterns are obtained in the Z-axis direction. The third transmission line CL3 and the eighth transmission line CL8 are symmetric with respect to a reference plane that extends through the center of the Z-axis direction of the signal lines 40D and 40G and is in parallel or substantially in parallel to the X-axis direction and the Y-axis direction. In the cross-sectional view illustrated in FIG. 16, the third transmission line CL3 and the eighth transmission line CL8 are in line symmetry with respect to a dashed-dotted line that extends in the Y-axis direction through the center in the Z-axis direction of the signal lines 40D and 40G. The second transmission line CL2 and the ninth transmission line CL9 are symmetric with respect to a reference plane that extends through the center of the Z-axis direction of the signal lines 40D and 40G and is in parallel or substantially in parallel to the X-axis direction and the Y-axis direction. In the cross-sectional view illustrated in FIG. 16, the second transmission line CL2 and the ninth transmission line CL9 are in line symmetry with respect to a dashed-dotted line that extends in the Y-axis direction through the center in the Z-axis direction of the signal lines 40D and 40G. The sixth transmission line CL6 and the tenth transmission line CL10 are symmetric with respect to a reference plane that extends through the center of the Z-axis direction of the signal lines 40D and 40G and is in parallel or substantially in parallel to the X-axis direction and the Y-axis direction. In the cross-sectional view illustrated in FIG. 16, the sixth transmission line CL6 and the tenth transmission line CL10 are in line symmetry with respect to a dashed-dotted line that extends in the Y-axis direction through the center in the Z-axis direction of the signal lines 40D and 40G.

The first transmission line CL1 and the fourth transmission line CL4 are symmetric with respect to a reference plane that extends through the center of the Z-axis direction of the signal lines 40C, 40B, and 40F and is in parallel or substantially in parallel to the X-axis direction and the Y-axis direction. In the cross-sectional view illustrated in FIG. 16, the first transmission line CL1 and the fourth transmission line CL4 are in line symmetry with respect to a dashed-dotted line that extends in the Y-axis direction through the center in the Z-axis direction of the signal lines 40C, 40B, and 40F. The fourth transmission line CL4 and the eleventh transmission line CL11 are symmetric with respect to a reference plane that extends through the center of the Z-axis direction of the signal lines 40H, 40J, and 40K and is in parallel or substantially in parallel to the X-axis direction and the Y-axis direction. In the cross-sectional view illustrated in FIG. 16, the fourth transmission line CL4 and the eleventh transmission line CL11 are in line symmetry with respect to a dashed-dotted line that extends in the Y-axis direction through the center in the Z-axis direction of the signal lines 40C, 40B, and 40F. The first transmission line CL1 and the eleventh transmission line CL11 are symmetric with respect to a reference plane that extends through the center of the Z-axis direction of the signal lines 40D and 40G and is in parallel or substantially in parallel to the X-axis direction and the Y-axis direction. In the cross-sectional view illustrated in FIG. 16, the first transmission line CL1 and the eleventh transmission line CL11 are in line symmetry with respect to a dashed-dotted line that extends in the Y-axis direction through the center in the Z-axis direction of the signal lines 40C, 40B, and 40F.

The fifth transmission line CL5 and the seventh transmission line CL7 are symmetric with respect to a reference plane that extends through the center of the Z-axis direction of the signal lines 40C, 40B, and 40F and is in parallel or substantially in parallel to the X-axis direction and the Y-axis direction. In the cross-sectional view illustrated in FIG. 16, the fifth transmission line CL5 and the seventh transmission line CL7 are in line symmetry with respect to a dashed-dotted line that extends in the Y-axis direction through the center in the Z-axis direction of the signal lines 40C, 40B, and 40F. The seventh transmission line CL7 and the twelfth transmission line CL12 are symmetric with respect to a reference plane that extends through the center of the Z-axis direction of the signal lines 40H, 40J, and 40K, and is in parallel or substantially in parallel to the X-axis direction and the Y-axis direction. In the cross-sectional view illustrated in FIG. 16, the seventh transmission line CL7 and the twelfth transmission line CL12 are in line symmetry with respect to a dashed-dotted line that extends in the Y-axis direction through the center in the Z-axis direction of the signal lines 40H, 40J, and 40K. The fifth transmission line CL5 and the twelfth transmission line CL12 are symmetric with respect to a reference plane that extends through the center of the Z-axis direction of the signal lines 40D and 40G and is in parallel or substantially in parallel to the X-axis direction and the Y-axis direction. In the cross-sectional view illustrated in FIG. 16, the fifth transmission line CL5 and the twelfth transmission line CL12 are in line symmetry with respect to a dashed-dotted line that extends in the Y-axis direction through the center in the Z-axis direction of the signal lines 40D and 40G.

As a result, in a similar manner to the multilayer substrate 109, structural and electromagnetic balance in the multilayer substrate 110 is improved.

It is to be noted that, while the tenth preferred embodiment of the present invention describes the example in which the 12 transmission lines are provided in the stacked body 10, more than 12 transmission lines may be able to be provided in the stacked body 10 by a similar configuration.

Figure 17:
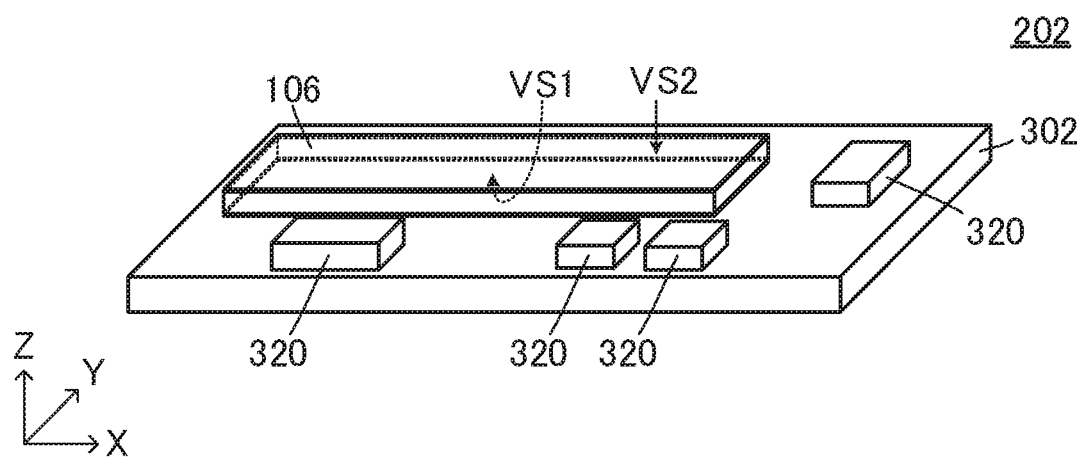
FIG. 17 is an external perspective view of an electronic device 202 according to the tenth preferred embodiment of the present invention.

In addition, although described above, by using the multilayer substrate described in each preferred embodiment, an electronic device as illustrated in FIG. 17 is able to be obtained. FIG. 17 is an external perspective view of an electronic device 202 according to the tenth preferred embodiment of the present invention. It is to be noted that, while FIG. 17 illustrates the example in which the multilayer substrate 106 is used, the multilayer substrates according to other preferred embodiments are also able to provide a similar structure.

The electronic device 202 includes a multilayer substrate 106, a circuit board 302, and a plurality of mounted components 320. The multilayer substrate 106 and the plurality of mounted components 320 are mounted on the surface of the circuit board 302. The multilayer substrate 106 is disposed such that the first primary surface VS1 faces the surface of the circuit board 302. Each of the external connection conductors of the multilayer substrate 106 is joined to a land conductor provided on the surface of the circuit board 302. In such a case, each of the external connection conductors is joined to a land conductor only through a conductive joining material such as solder. In other words, the multilayer substrate 106 is surface-mounted on the circuit board 302.

As described above, when the multilayer substrate 106 is surface-mounted on the circuit board 302, the distance between the multilayer substrate 106 and the surface of the circuit board 302 becomes smaller as compared with an example in which a connector or the like is used. However, as described above, the multilayer substrate 106 includes a fourth ground conductor 34 on the first primary surface VS1, the fourth ground conductor 34 being overlapped with all the signal lines in the stacked body 10 (see FIG. 12). Therefore, unnecessary radiation from the multilayer substrate 106 to the circuit board 302 is significantly reduced or prevented. As a result, electromagnetic coupling between the multilayer substrate 106 and the circuit board 302 is significantly reduced or prevented. In addition, the fourth ground conductor 34 that is overlapped with all the signal lines in the stacked body 10 is provided, so that the occurrence of the uneven irregularities of the surface (the first primary surface VS1 or the second primary surface VS2) of the multilayer substrate 106 is significantly reduced or prevented, and the mounting performance during surface-mounting to the circuit board 302 or the like is improved.

Eleventh Preferred Embodiment

Figure 18A:
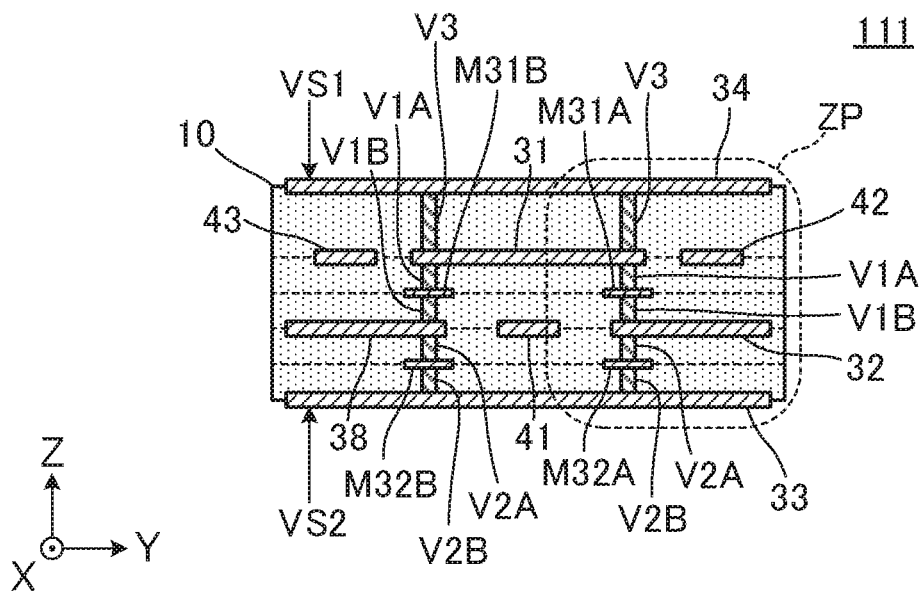
FIG. 18A is a cross-sectional view of a multilayer substrate 111 according to an eleventh preferred embodiment of the present invention.
Figure 18B:
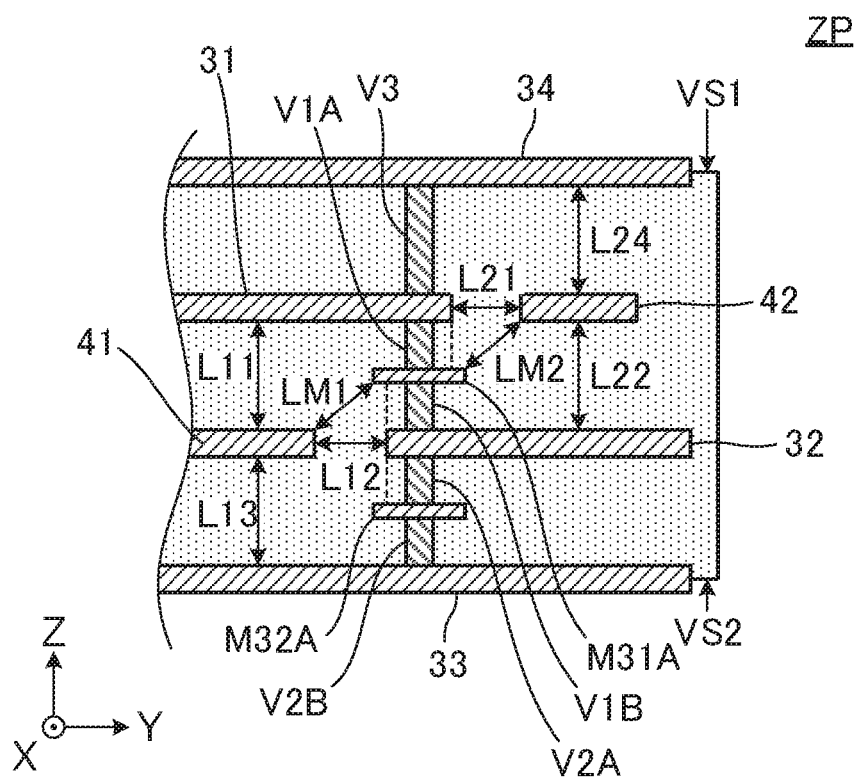
FIG. 18B is an enlarged cross-sectional view of a ZP portion in FIG. 18A.

FIG. 18A is a cross-sectional view of a multilayer substrate 111 according to an eleventh preferred embodiment of the present invention, and FIG. 18B is an enlarged cross-sectional view of a ZP portion in FIG. 18A. The multilayer substrate 111 according to the eleventh preferred embodiment is different from the multilayer substrate 106 according to the sixth preferred embodiment in that the multilayer substrate 111 includes first intermediate ground conductors M31A and M31B, and second intermediate ground conductors M32A and M32B. In addition, the stacked body 10 of the multilayer substrate 111 is different from the multilayer substrate 106 in that five insulating base materials are stacked. Other configurations of the multilayer substrate 111 are substantially the same as the configurations of the multilayer substrate 106, and a description of the same or similar configuration will be omitted.

As illustrated in FIG. 18A, the first intermediate ground conductor M31A is provided between a layer on which a first signal line 41 is provided and a layer on which a second signal line 42 is provided, in the stacking direction (the Z-axis direction). The first intermediate ground conductor M31A is disposed between the first signal line 41 and the second signal line 42 when viewed in the stacking direction. The first intermediate ground conductor M31A continuously extends in parallel or substantially in parallel with the first signal line 41 and the second signal line 42 (not illustrated). At least a portion of the first intermediate ground conductor 31A is overlapped with a first ground conductor 31, a second ground conductor 32, a third ground conductor 33, and a fourth ground conductor 34 when viewed in the stacking direction. The first intermediate ground conductor M31A is connected to the first ground conductor 31 through an interlayer connection conductor V1A, and is connected to the second ground conductor 32 through an interlayer connection conductor V1B.

The first intermediate ground conductor M31B is provided between the layer on which the first signal line 41 is provided and a layer on which a third signal line 43 is provided, with respect to the stacking direction. The first intermediate ground conductor M31B is disposed between the first signal line 41 and the third signal line 43 when viewed in the stacking direction. The first intermediate ground conductor M31B continuously extends in parallel or substantially in parallel with the first signal line 41 and the third signal line 43 (not illustrated). At least a portion of the first intermediate ground conductor 31B is overlapped with the first ground conductor 31, the third ground conductor 33, the fourth ground conductor 34, and an eighth ground conductor 38 when viewed in the stacking direction. The first intermediate ground conductor M31B is connected to the first ground conductor 31 through the interlayer connection conductor V1A, and is connected to the eighth ground conductor 38 through the interlayer connection conductor V1B.

Hereinafter, although only the first intermediate ground conductor M31A is mainly described, the first intermediate ground conductor M31B also has the same or substantially the same configuration.

As illustrated in FIG. 18B, the first intermediate ground conductor M31A extends farther toward the first signal line 41 than to the second ground conductor 32 when viewed in the stacking direction, and includes a portion that is not overlapped with the second ground conductor 32. It is to be noted that the first intermediate ground conductor M31A is spaced farther apart from the first signal line 41 than at least one of the other ground conductors (such as the first ground conductor 31, the second ground conductor 32, the third ground conductor 33). Specifically, as illustrated in FIG. 18B, when a distance between the first signal line 41 and the first ground conductor 31 is indicated by L11, a distance between the first signal line 41 and the second ground conductor 32 is indicated by L12, a distance between the first signal line 41 and the third ground conductor 33 is indicated by L13, and a distance between the first signal line 41 and the first intermediate ground conductor M31A is indicated by LM1, the distance LM1 is larger than any one of the distances L11, L12, and L13.

In addition, as illustrated in FIG. 18B, the first intermediate ground conductor M31A extends farther toward the second signal line 42 than to the first ground conductor 31 when viewed in the stacking direction, and includes a portion that is not overlapped with the first ground conductor 31. It is to be noted that the first intermediate ground conductor M31A is spaced farther apart from the second signal line 42 than at least one of the other ground conductors (such as the first ground conductor 31, the second ground conductor 32, the fourth ground conductor 34). Specifically, as illustrated in FIG. 18B, when a distance between the second signal line 42 and the first ground conductor 31 is indicated by L21, a distance between the second signal line 42 and the second ground conductor 32 is indicated by L22, a distance between the second signal line 42 and the fourth ground conductor 34 is indicated by L24, and a distance between the second signal line 42 and the first intermediate ground conductor M31A is indicated by LM2, the distance LM2 is larger than any one of the distances L21, L22, and L24.

Further, the thickness of the first intermediate ground conductor M31A in the stacking direction is thinner than the thickness of the other ground conductors (the first ground conductor 31, the second ground conductor 32, the third ground conductor 33, and the fourth ground conductor 34) in the stacking direction.

As illustrated in FIGS. 18A and 18B, the second intermediate ground conductor M32A is provided between the layer on which the first signal line 41 is provided and the second primary surface VS2, with respect to the stacking direction. The second intermediate ground conductor M32A continuously extends in parallel or substantially in parallel with the first signal line 41 (not illustrated). The second intermediate ground conductor M32A is connected to the second ground conductor 32 through an interlayer connection conductor V2A, and is connected to the third ground conductor 33 through an interlayer connection conductor V2B.

The second intermediate ground conductor M32B is provided between the layer on which the first signal line 41 is provided and the second primary surface VS2, with respect to the stacking direction. The second intermediate ground conductor M32B continuously extends in parallel or substantially in parallel with the first signal line 41 (not illustrated). The second intermediate ground conductor M32B is connected to the eighth ground conductor 38 through the interlayer connection conductor V2A, and is connected to the third ground conductor 33 through an interlayer connection conductor V2B.

According to the multilayer substrate 111 according to the eleventh preferred embodiment, the following operational effect is able to be further obtained.

In the multilayer substrate 111, the first intermediate ground conductor M31A is provided between the layer on which the first signal line 41 is provided and the layer on which the second signal line 42 is provided, with respect to the stacking direction. In addition, the first intermediate ground conductor M31A is disposed between the first signal line 41 and the second signal line 42 when viewed in the stacking direction. With this configuration, the isolation between the first signal line 41 and the second signal line 42 is further increased, and the effect of reducing cross talk is further enhanced. It is to be noted that, in the eleventh preferred embodiment, the first intermediate ground conductor M31B is provided, so that the isolation between the first signal line 41 and the third signal line 43 is further increased, and the effect of reducing cross talk is further enhanced.

In addition, in the eleventh preferred embodiment, the first intermediate ground conductor M31A extends farther toward the first signal line 41 than to the second ground conductor 32 when viewed in the stacking direction, and includes a portion that is not overlapped with the second ground conductor 32. With this configuration, since the first intermediate ground conductor M31A is disposed closer to the first signal line 41, the magnetic field to be generated around the first signal line 41 is effectively shielded, and the isolation between the first signal line 41 and the second signal line 42 is able to be further increased.

It is to be noted that, in the eleventh preferred embodiment, the first intermediate ground conductor M31A is spaced farther apart from the first signal line 41 than at least one of the other ground conductors. Therefore, the isolation between the first signal line 41 and the second signal line 42 is able to be increased without greatly affecting capacitance to be generated between the first signal line 41 and the other ground conductors.

In addition, in the eleventh preferred embodiment, the first intermediate ground conductor M31A extends farther toward the second signal line 42 than to the first ground conductor 31 when viewed in the stacking direction, and includes a portion that is not overlapped with the first ground conductor 31. With this configuration, since the first intermediate ground conductor M31A is disposed closer to the second signal line 42, the magnetic field to be generated around the second signal line 42 is effectively shielded, and the isolation between the first signal line 41 and the second signal line 42 is able to be further increased.

It is to be noted that, in the eleventh preferred embodiment, the first intermediate ground conductor M31A is spaced farther apart from the second signal line 42 than at least one of the other ground conductors. Therefore, the isolation between the first signal line 41 and the second signal line 42 is able to be increased without greatly affecting capacitance to be generated between the second signal line 42 and the other ground conductors.

Further, the thickness of the first intermediate ground conductors M31A and M31B in the stacking direction is thinner than the thickness of the other ground conductors in the stacking direction. Since the first intermediate ground conductors M31A and M31B are disposed at positions that are overlapped with a large number of conductors in the stacking direction, in the eleventh preferred embodiment, irregularities are easily formed on the surface of the multilayer substrate after the stacked body 10 is obtained. However, with this configuration, irregularities are able to be significantly reduced or prevented from being formed on the surface of the multilayer substrate.

Figure 19:
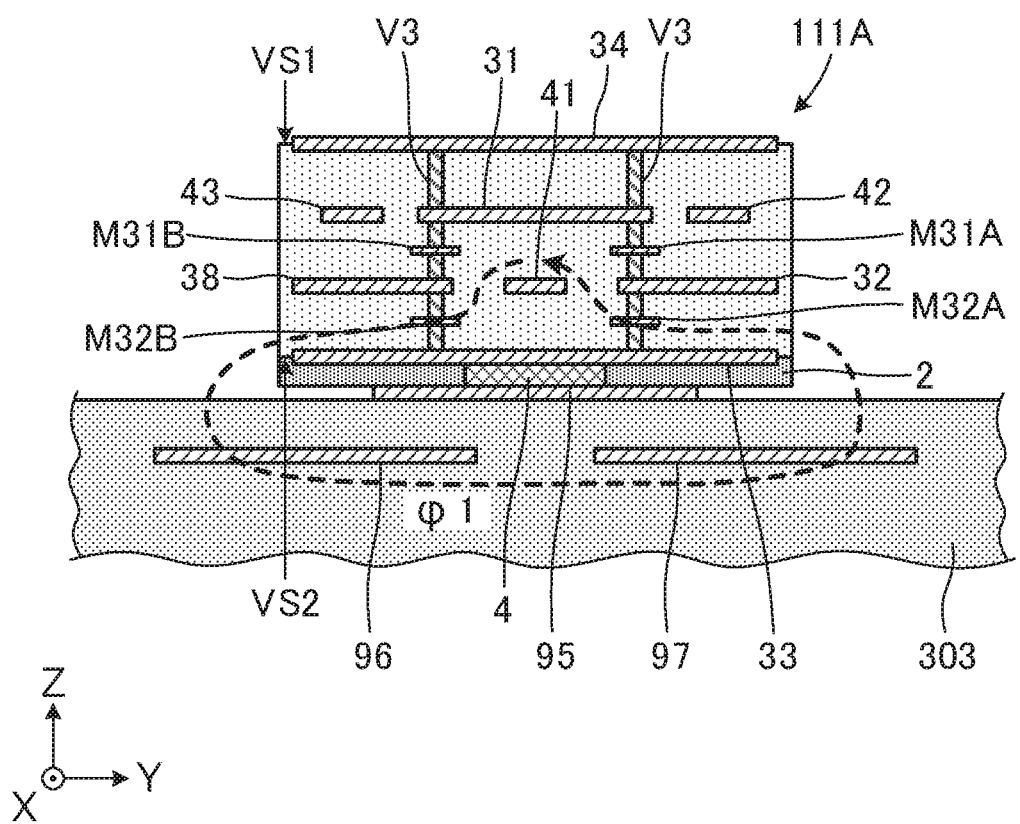
FIG. 19 is an external perspective view of an electronic device 203 according to the eleventh preferred embodiment of the present invention.

By using the multilayer substrate 111 according to the eleventh preferred embodiment, the following electronic device is able to be obtained. FIG. 19 is an external perspective view of an electronic device 203 according to the eleventh preferred embodiment of the present invention.

The electronic device 203 includes a multilayer substrate 111A and a circuit board 303.

The multilayer substrate 111A is different from the multilayer substrate 111 in that the multilayer substrate 111A includes a protective layer 2 on the second primary surface VS2. Other configurations of the multilayer substrate 111A are the same or substantially the same as the configurations of the multilayer substrate 111. The protective layer 2 includes an opening, and the protective layer 2 is provided on the second primary surface VS2, so that a portion of the third ground conductor 33 is exposed. The surface of the circuit board 303 includes a conductor 95, and the inside of the circuit board 303 includes conductors 96 and 97 and the like.

The multilayer substrate 111A is disposed such that the second primary surface VS2 faces the surface of the circuit board 303. As illustrated in FIG. 19, the third ground conductor 33 of the multilayer substrate 111A is joined to the circuit board 303 through a conductive joining material 4 such as solder. In other words, the multilayer substrate 111A is surface-mounted on the circuit board 303.

Therefore, among the first signal line 41, the second signal line 42, and the third signal line 43, the first signal line 41 is disposed closest to the mounting surface (the front surface) of the circuit board 303. In addition, the second intermediate ground conductors M32A and M32B are provided, in the stacking direction (the Z-axis direction), between the mounting surface and the layer on which the first signal line 41 is provided.

With the configuration of the electronic device 203 according to the eleventh preferred embodiment, the following operational effect is able to be further obtained in addition to the operational effect obtained by the electronic device 202 described in the tenth preferred embodiment. Hereinafter, although only the second intermediate ground conductor M32A is mainly described, the second intermediate ground conductor M32B also has the same or substantially the same configuration.

In the electronic device 203, among the first signal line 41, the second signal line 42, and the third signal line 43, the first signal line 41 is disposed closest to the mounting surface of the circuit board 303. In addition, the second intermediate ground conductors M32A is provided, with respect to the stacking direction, between the mounting surface of the circuit board 303 and the layer on which the first signal line 41 is provided. In addition, the second intermediate ground conductor M32A is disposed between the first signal line 41 and the second signal line 42 (side of the positive Y direction of the first signal line 41), when viewed in the stacking direction. With this configuration, by the magnetic field to be generated around the first signal line 41, coupling between the first signal line 41 and the conductors provided in contact with the circuit board 303 is significantly reduced or prevented (see the magnetic flux ϕ1 to be generated around the first signal line 41 illustrated in FIG. 19).

In addition, in the eleventh preferred embodiment, the second intermediate ground conductor M32A extends farther toward the first signal line 41 than to the second ground conductor 32 when viewed in the stacking direction, and includes a portion that is not overlapped with the second ground conductor 32. With this configuration, since the second intermediate ground conductor M32A is disposed closer to the first signal line 41, the magnetic field to be generated around the first signal line 41 is effectively shielded, and the coupling between the first signal line 41 and the conductors provided in contact with the circuit board 303 is able to be significantly reduced or prevented.

Further, in the eleventh preferred embodiment, the second intermediate ground conductor M32A is spaced farther apart from the first signal line 41 than at least one of the other ground conductors. Therefore, the coupling between the first signal line 41 and the conductors provided in contact with the circuit board 303 is able to be significantly reduced or prevented without greatly affecting capacitance to be generated between the first signal line 41 and the other ground conductors.

In addition, the thickness of the second intermediate ground conductors M32A and M32B in the stacking direction is thinner than the thickness of the other ground conductors in the stacking direction. Since the second intermediate ground conductors M32A and M32B are disposed at positions that are overlapped with a large number of conductors in the stacking direction, in the eleventh preferred embodiment, irregularities are easily formed on the surface of the multilayer substrate after the stacked body 10 is obtained. However, according to this configuration, irregularities are able to be significantly reduced or prevented from being formed on the surface of the multilayer substrate.

It is to be noted that, while the eleventh preferred embodiment has described the example in which the first intermediate ground conductors M31A and M31B and the second intermediate ground conductors M32A and M32B continuously extend in parallel or substantially in parallel with each other along the first signal line 41 and the second signal line 42, the present invention is not limited to such a configuration. The first intermediate ground conductors and the second intermediate ground conductors may intermittently extend in parallel or substantially in parallel with the first signal line 41 and the second signal line 42. In such a case, the first intermediate ground conductors and the second intermediate ground conductors may preferably be connected to another ground conductor by the interlayer connection conductor or the like.

Other Preferred Embodiments

While each of the above described preferred embodiments is an example in which a stacked body has a rectangular or substantially rectangular parallelepiped shape, the present invention is not limited to such a configuration. The plane shape of the stacked body is not limited to a rectangle or substantially a rectangle and is able to be appropriately changed in the range in which the functions and effects of preferred embodiments of the present invention are obtained. The plane shape of the stacked body may be a circle, an ellipse, a polygon, an L shape, a crank shape, a T shape, or a Y shape, for example.

While each of the above described preferred embodiments has described the multilayer substrate provided with the stacked body obtained by stacking two, four, or six insulating base materials, the present invention is not limited to such a configuration. The number of layers of insulating base materials to obtain the stacked body is able to be appropriately changed in the range in which the functions and effects of preferred embodiments of the present invention are obtained.

In addition, while each of the above described preferred embodiments has described the multilayer substrate in which the protective layer 1 is provided only on the first primary surface VS1 of the stacked body or the multilayer substrate in which the protective layers 1 and 2 are provided on both the first primary surface VS1 and second primary surface VS2 of the stacked body, the present invention is not limited to such a configuration. The multilayer substrate may be a multilayer substrate in which the protective layer is provided only on the second primary surface VS2 of the stacked body. It is to be noted that, in the multilayer substrate according to preferred embodiments of the present invention, a protective layer is not essential.

While each of the above described preferred embodiments has described the example in which the connection portions (the first connection portion CP1 and the second connection portion CP2) are provided in the vicinity of the end portions (the first end portion and the second end portion) in the longitudinal direction of the stacked body, the present invention is not limited to such a configuration. The positions of the connection portions are able to be appropriately changed within the scope of operations and features of the preferred embodiments of the present invention, the connection portions may be provided in the vicinity of the center in the longitudinal direction of the stacked body, for example.

While each of the above described preferred embodiments has described the multilayer substrate in which the connection portions (the first connection portion CP1 and the second connection portion CP2) are provided only on the first primary surface VS1 of the stacked body 10, the present invention is not limited to such a configuration. The multilayer substrate may be a multilayer substrate in which the connection portion is provided only on the second primary surface VS2 of the stacked body. In addition, the multilayer substrate may be a multilayer substrate in which the connection portion is provided on both the first primary surface VS1 and second primary surface VS2 of the stacked body.

While each of the above described preferred embodiments has described the multilayer substrate in which the first connection portion CP1, the line portion SL, and the second connection portion CP2 are disposed in this order in the X-axis direction, the present invention is not limited to such a configuration. The arrangement of the connection portions (the first connection portion CP1, the second connection portion CP2, and the like) and the line portion SL is able to be appropriately changed in the range in which the functions and effects of preferred embodiments of the present invention are obtained. In addition, while each of the above described preferred embodiments has described the example in which the line portion SL (the first signal line 41, the second signal line 42, and the like) is a conductor extending in the X-axis direction, the present invention is not limited to such a configuration. The line portion (the first signal line 41, the second signal line 42, and the like) does not necessarily need to have a linear shape extending in the X-axis direction, and may bend in the Y-axis direction, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A transmission line substrate comprising:
a stacked body that includes a first surface and a second surface facing each other, includes a first face, a second face, a third face, and a fourth face, and includes a plurality of insulating base material layers stacked on each other;
a first signal line that is provided on any one of the plurality of insulating base material layers;
a second signal line that is provided on any one of the plurality of insulating base material layers;
a first ground conductor that is provided on any one of the plurality of insulating base material layers;
a second ground conductor that is provided on any one of the plurality of insulating base material layers;
a third ground conductor that is provided on any one of the plurality of insulating base material layers;
a fourth ground conductor that is provided on any one of the plurality of insulating base material layers;
a surface side ground conductor that is provided in contact with the stacked body, and is overlapped with the first ground conductor, the second ground conductor, the first signal line, and the second signal line when viewed in a stacking direction in which the plurality of insulating base material layers are stacked;
a first interlayer connection conductor that is provided in any one of the plurality of insulating base material layers;
a second interlayer connection conductor that is provided in any one of the plurality of insulating base material layers;
a third interlayer connection conductor that is provided in any one of the plurality of insulating base material layers;
a fourth interlayer connection conductor that is provided in any one of the plurality of insulating base material layers;
a plurality of first external connection electrodes that are provided on at least one of the first surface or the second surface, and are connected to the first signal line;
a plurality of second external connection electrodes that are provided on at least one of the first surface or the second surface, and are connected to the second signal line;
a first transmission line including the first signal line, the first ground conductor, and a first insulating base material layer among the plurality of insulating base material layers, the first insulating base material layer being interposed between the first signal line and the first ground conductor; and
a second transmission line including the second signal line, the second ground conductor, and the first insulating base material layer being interposed between the second signal line and the second ground conductor; wherein
the stacked body has an elongated shape that extends in a transmission direction in which the first signal line and the second signal line extend;
the second signal line is provided on the first face different from the second face on which the first signal line is provided and extends in parallel or substantially in parallel with the first signal line when viewed in the stacking direction;
the surface side ground conductor is located closer to the first surface than to the first face;
the first ground conductor is provided on the first face, and is overlapped with the first signal line when viewed in the stacking direction;
the second ground conductor is provided on the second face, and is overlapped with the second signal line when viewed in the stacking direction;
the third ground conductor is provided on the third face different from the second face, and is disposed so as to face the first ground conductor across the first signal line with respect to the stacking direction;
the fourth ground conductor is provided on the fourth face different from the first face, and is disposed so as to face the second ground conductor across the second signal line with respect to the stacking direction;
the first interlayer connection conductor electrically connects the first ground conductor and the second ground conductor;
the first interlayer connection conductor is located between the first signal line and the second signal line when viewed in the stacking direction, and extends from the first ground conductor to the second ground conductor;
the second interlayer connection conductor electrically connects the second ground conductor and the third ground conductor;
the second interlayer connection conductor is located between the first signal line and the second signal line when viewed in the stacking direction;

the third interlayer connection conductor electrically connects the first ground conductor and the fourth ground conductor;

the third interlayer connection conductor is located between the first signal line and the second signal line when viewed in the stacking direction, and extends from the first ground conductor to the fourth ground conductor;

the fourth interlayer connection conductor electrically connects the fourth ground conductor and the surface side ground conductor;

the fourth interlayer connection conductor is located between the first signal line and the second signal line when viewed in the stacking direction;

the plurality of first external connection electrodes are respectively disposed in a vicinity of opposite ends of the stacked body in the transmission direction; and the plurality of second external connection electrodes are respectively disposed in a vicinity of opposite ends of the stacked body in the transmission direction.

2. The transmission line substrate according to claim 1, further comprising:

a fifth ground conductor that is provided on any one of the plurality of insulating base material layers; and a sixth ground conductor that is provided on any one of the plurality of insulating base material layers; wherein the fifth ground conductor is provided on the second face, extends in parallel or substantially in parallel with the first signal line, and is disposed opposite to the second ground conductor with respect to the first signal line; and the sixth ground conductor is provided on the first face, extends in parallel or substantially in parallel with the second signal line, and is disposed opposite to the first ground conductor with respect to the second signal line.

3. The transmission line substrate according to claim 1, wherein each of the plurality of insulating base material layers is made of a thermoplastic resin.

4. The transmission line substrate according to claim 1, wherein the first transmission line and the second transmission line include a bent portion that is bent in the stacking direction.

5. The transmission line substrate according to claim 1, wherein the stacked body has flexibility.

6. The transmission line substrate according to claim 1, wherein the surface side ground conductor is overlapped with all signal lines and all ground conductors when viewed in the stacking direction.

7. The transmission line substrate according to claim 1, further comprising a first intermediate ground conductor that is provided between the second face and the first face, with respect to the stacking direction, wherein the first intermediate ground conductor is disposed between the first signal line and the second signal line when viewed in the stacking direction.

8. The transmission line substrate according to claim 7, wherein the first intermediate ground conductor has a thickness smaller in the stacking direction than a thickness of other ground conductors.

9. The transmission line substrate according to claim 7, wherein the first intermediate ground conductor is spaced farther apart from the first signal line or the second signal line than at least one of other ground conductors.

10. The transmission line substrate according to claim 9, wherein the first intermediate ground conductor includes a portion that, when viewed in the stacking direction, extends farther toward the first signal line than to the second ground conductor and is not overlapped with the second ground conductor.

11. The transmission line substrate according to claim 9, wherein the first intermediate ground conductor includes a portion that, when viewed in the stacking direction, extends farther toward the second signal line than to the first ground conductor and is not overlapped with the first ground conductor.

12. The transmission line substrate according to claim 1, further comprising a third signal line that extends in parallel or substantially in parallel with the second signal line, wherein the third signal line is disposed at a same position as the second signal line in the stacking direction;

the third signal line is disposed opposite to the second signal line across the first ground conductor in a width direction that is perpendicular or substantially perpendicular to the stacking direction and a parallel direction in which signal lines extend in parallel or substantially in parallel with each other; and the third signal line is disposed at a position symmetric to the second signal line with respect to a reference plane that extends through a center in a width direction of the first ground conductor and is in parallel or substantially in parallel to the parallel direction and the stacking direction.

13. The transmission line substrate according to claim 12, further comprising a third transmission line that includes the third signal line, wherein the third transmission line and the second transmission line are disposed at positions symmetric to each other with respect to the reference plane.

14. The transmission line substrate according to claim 1, further comprising a fourth signal line that extends in parallel or substantially in parallel with the first signal line, wherein the fourth signal line is disposed at a position symmetric to the first signal line with reference to the first ground conductor in the stacking direction.

15. The transmission line substrate according to claim 14, further comprising a fourth transmission line that includes the fourth signal line, wherein the fourth transmission line and the first transmission line are disposed at positions symmetric to each other with reference to the first ground conductor.

16. The transmission line substrate according to claim 15, further comprising transmission lines of a predetermined number; wherein the transmission lines of a predetermined number include five or more transmission lines that include the first transmission line to the fourth transmission line; and the transmission lines of a predetermined number are symmetrically disposed in the stacking direction and a first direction perpendicular or substantially perpendicular to the stacking direction.

17. An electronic device comprising:

the transmission line substrate according to claim 1; and a circuit board on which the transmission line substrate is surface-mounted.

18. The electronic device according to claim 17, wherein the circuit board includes a mounting surface;

the first signal line is closer to the mounting surface than the second signal line;

the transmission line substrate includes a second intermediate ground conductor that is provided between the mounting surface and the second face, with respect to the stacking direction; and the second intermediate ground conductor is disposed between the first signal line and the second signal line when viewed in the stacking direction.

19. The electronic device according to claim 18, wherein the second intermediate ground conductor is spaced farther apart from the first signal line than at least one of other ground conductors.

20. The electronic device according to claim 19, wherein the second intermediate ground conductor includes a portion that, when viewed in the stacking direction, extends farther toward the first signal line than to the second ground conductor and is not overlapped with the second ground conductor.

21. The electronic device according to claim 18, wherein the second intermediate ground conductor has a thickness smaller in the stacking direction than a thickness of other ground conductors.

* * * * *